US012746637B2

(12) United States Patent
You et al.

(10) Patent No.: US 12,746,637 B2
(45) Date of Patent: Sep. 29, 2026

(54) METHODS OF FORMING AN ABRASIVE SLURRY AND METHODS FOR CHEMICAL-MECHANICAL POLISHING

(71) Applicant: Taiwan Semiconductor Manufacturing Co., Ltd., Hsinchu (TW)

(72) Inventors: Sheng-Mu You, Zhunan City (TW); Chi-Jen Liu, Taipei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 571 days.

(21) Appl. No.: 18/301,462

(22) Filed: Apr. 17, 2023

(65) Prior Publication Data

US 2024/0342856 A1 Oct. 17, 2024

(51) Int. Cl.

| | |
|---|---|
| ***B24B 37/04*** | (2012.01) |
| ***B24B 1/00*** | (2006.01) |
| ***C09G 1/02*** | (2006.01) |
| ***C09G 1/04*** | (2006.01) |
| ***C09G 1/06*** | (2006.01) |
| ***C09K 3/14*** | (2006.01) |
| ***C09K 13/06*** | (2006.01) |
| ***H10P 52/40*** | (2026.01) |

(52) U.S. Cl.

CPC .............. *B24B 37/044* (2013.01); *B24B 1/00* (2013.01); *C09G 1/02* (2013.01); *C09G 1/04* (2013.01); *C09G 1/06* (2013.01); *C09K 3/1409* (2013.01); *C09K 3/1436* (2013.01); *C09K 3/1463* (2013.01); *C09K 13/06* (2013.01); *H10P 52/402* (2026.01); *H10P 52/403* (2026.01)

(58) Field of Classification Search

None

See application file for complete search history.

(56) References Cited

U.S. PATENT DOCUMENTS

| | | | |
|---|---|---|---|
| 7,803,711 | B2 | 9/2010 | White et al. |
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |

(Continued)

FOREIGN PATENT DOCUMENTS

| | | |
|---|---|---|
| CN | 109643557 A | 4/2019 |
| JP | 2023512216 A | 3/2023 |

(Continued)

OTHER PUBLICATIONS

V. Kilmkevicius et al., Langmuir, vol. 31, pp. 2074-2083 (Year: 2015).*

*Primary Examiner* — Jiong-Ping Lu

(74) *Attorney, Agent, or Firm* — Slater Matsil, LLP

(57) ABSTRACT

A method of performing a polishing process is provided. The method may include forming spherical titanium dioxide nano-particles, covering the spherical titanium dioxide nano-particles with an organic coating, storing the spherical titanium dioxide nano-particles together with an oxidizer, forming a polishing solution with the spherical titanium dioxide nano-particles, applying the polishing solution on a surface of a work piece, and polishing the surface of the work piece with the polishing solution.

20 Claims, 20 Drawing Sheets

(56) References Cited

U.S. PATENT DOCUMENTS

| | | | |
|---|---|---|---|
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,937,691 B2 | 3/2021 | Lee et al. | |
| 2003/0022502 A1* | 1/2003 | Matsui | C09G 1/02 438/692 |
| 2009/0075566 A1* | 3/2009 | White | B24B 37/044 451/37 |
| 2013/0045599 A1 | 2/2013 | Ye | |
| 2020/0032104 A1 | 1/2020 | Nakagawa et al. | |
| 2021/0238448 A1 | 8/2021 | Singh et al. | |
| 2023/0008720 A1 | 1/2023 | Ito et al. | |

FOREIGN PATENT DOCUMENTS

| | | |
|---|---|---|
| KR | 20210050246 A | 5/2021 |
| KR | 102520916 B1 | 4/2023 |
| TW | I384060 B | 2/2013 |
| TW | 201531540 A | 8/2015 |
| TW | I695752 B | 6/2020 |
| TW | I721571 B | 3/2021 |

* cited by examiner

METHODS OF FORMING AN ABRASIVE SLURRY AND METHODS FOR CHEMICAL-MECHANICAL POLISHING

BACKGROUND

Generally, contacts down to a semiconductor substrate may be made by first forming a dielectric layer and then forming openings within the dielectric layer to expose the underlying substrate where contact is desired to be made. Once the openings have been formed, a barrier layer may be formed within the openings and conductive material may be used to fill the remainder of the openings using, e.g., a plating process. This plating process usually fills and overfills the openings, causing a layer of the conductive material to extend up beyond the dielectric layer.

A chemical mechanical polishing (CMP) may be performed to remove the excess conductive material and the barrier layer from outside of the openings and to isolate the conductive material and the barrier layer within the openings. For example, the excess conductive material may be contacted to a polishing pad, and the two may be rotated in order to grind excess conductive material away. This grinding process may be assisted by the use of a CMP slurry, which may contain chemicals and abrasives that can assist in the grinding process and help remove the conductive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
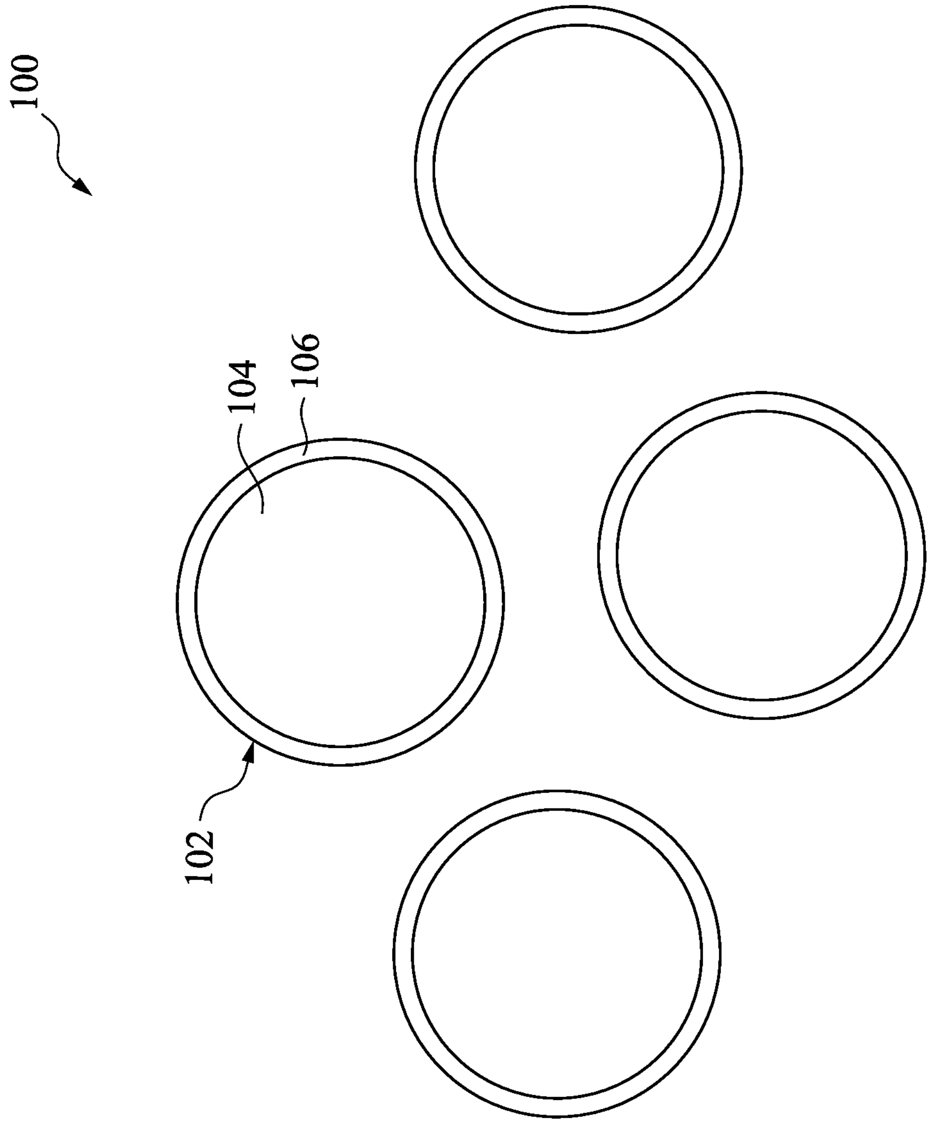
FIGS. 1A-1C illustrate a protected abrasive particle solution and the forming of the protected abrasive particle solution, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various CMP slurries, and the method of forming and using the same are provided. In accordance with some embodiments, abrasive particles in the various CMP slurries may be formed into spherical shapes, which may eliminate or reduce scratches that the various CMP slurries may cause on the surface of a work piece after various CMP processes. In accordance with some embodiments, protective layers may be formed over the abrasive particles in the precursor of the various CMP slurries, which may prolong the shelf life of the precursor of the various CMP slurries, thereby reducing the cost of forming the various CMP slurries and performing the various CMP processes, and increasing the efficiency thereof. In accordance with some embodiments, the pH value of the various CMP slurries may be controlled, which results in different functionalities of the various CMP slurries during the various CMP processes. A CMP system is also provided. In accordance with some embodiments, the CMP system may have a slurry arm where slurry nozzles are disposed near delocalized light sources on the slurry arm, which may lead to a more effective interaction between the optical radiation and the various CMP slurries, thereby resulting in higher removal rates of materials on the surface of the work piece during the various CMP processes.

In FIG. 1A, a portion of a protected abrasive particle solution 100 is shown. The protected abrasive particle solution 100 may be a precursor of various CMP slurries as described in greater detail below. The protected abrasive particle solution 100 may comprise a plurality of similar protected abrasive particles 102 and a solvent (not shown), such as water or the like. The protected abrasive particles 102 may comprise abrasive particles 104 and protective layers 106 over the abrasive particles 104. In some embodiments, the protective layers 106 partially cover the surfaces of the abrasive particles 104. The abrasive particles 104 may be single crystals and may have spherical shapes, which may eliminate or reduce scratching during a subsequent CMP process where abrasive particles 104 are used as abrasives to polish a surface of a work piece, as discussed in greater detail below. The abrasive particles 104 may comprise an oxide material, such as titanium dioxide or the like. The protective layers 106 may comprise an organic material, such as an alkyl silicon containing organic material (e.g., a derivative of an alkyltrihydroxysilane) or the like.

The following provides an example of forming protected abrasive particle solution 100 containing protected abrasive particles 102, which may comprise first forming the abrasive particles 104 and then forming the protective layers 106 over the abrasive particles 104. A titanium containing reagent, such as titanium isopropoxide, tetrabutyl orthotitanate, or the like, may be mixed with an acid, such as hydrochloric acid, sulfuric acid, or the like, in an aqueous solution under a temperature in a range from about 50° C. to about 60° C. A hydrolysis reaction may take place between the titanium containing reagent and the acid in the aqueous solution, which may last for a time in a range from about 6 hours to about 24 hours. An alcohol, such as methanol or the like, may be added to the aqueous solution after the hydrolysis reaction, while the aqueous solution may be kept under a temperature in a range from about 50° C. to about 60° C. A neutralization reaction may take place in the aqueous solution. Then a centrifugal purification may be done to purify the products of the hydrolysis reaction and the neutralization reaction, which are then placed in an argon environment under a temperature in a range from about 100° C. to about 600° C. for a time in a range from about 1 hour to about 4 hours. A calcination reaction may take place among the products of the hydrolysis reaction and the neutralization reaction. Afterwards, the products of the calcination reaction is added into water to form a colloidal solution of the abrasive particles 104, such as titanium dioxide spherical nano-particles.

In the embodiments where the abrasive particles 104 are titanium dioxide spherical nano-particles, the abrasive particles 104 are single crystals with various crystalline structures and diameters in a range from about 15 nm to about 200 nm. Some abrasive particles 104 may have anatase crystalline structures and some abrasive particles 104 may have rutile crystalline structures. The conditions of the calcination reaction may affect the ratio of the number of abrasive particles 104 with anatase crystalline structures to the number of abrasive particles 104 with rutile crystalline structures. In the embodiments where the aforementioned conditions of the calcination reaction are applied, a majority (more than half), such as about 65%, of the abrasive particles 104 have anatase crystalline structures, and a minority (less than half), such as about 35%, of the abrasive particles 104 have rutile crystalline structures. As a result, a ratio of the number of abrasive particles 104 with anatase crystalline structures to the number of abrasive particles 104 with rutile crystalline structures may be in a range from about 1.8 to about 1.9, which may be beneficial to a subsequent CMP process, as discussed in greater detail below.

Next, the abrasive particles 104 in the colloidal solution may react with coupling agents 106A (shown in FIG. 1B), such as an alkyl silicon containing organic material or the like, and an acid, such as hydrochloric acid, sulfuric acid, or the like, under a temperature in a range from about 50° C. to about 60° C. A hydrolysis reaction may take place among the abrasive particles 104, the coupling agents 106A, and the acid in the colloidal solution, which may last for a time in a range from about 6 hours to about 24 hours. An alcohol, such as methanol, or the like, may be added to the colloidal solution after the hydrolysis reaction, while the colloidal solution may be kept under a temperature in a range from about 50° C. to about 60° C. A neutralization reaction may take place in the colloidal solution. Then a centrifugal purification may be done to purify the products of the hydrolysis reaction and the neutralization reaction to form the protected abrasive particle solution 100 containing the protected abrasive particles 102. An oxidizer 107 (shown in FIG. 1C), such as hydrogen peroxide or the like, may be added to the protected abrasive particle solution 100 and oxidize the protected abrasive particles 102. Such oxidation reaction may be referred to as a Fenton reaction. Afterwards, the protected abrasive particle solution 100 may be stored under room temperature for an extended period of time, such as longer than 10 days, before being used as a part of a CMP slurry for a subsequent CMP process, as discussed in greater detail below.

Figure 1B:
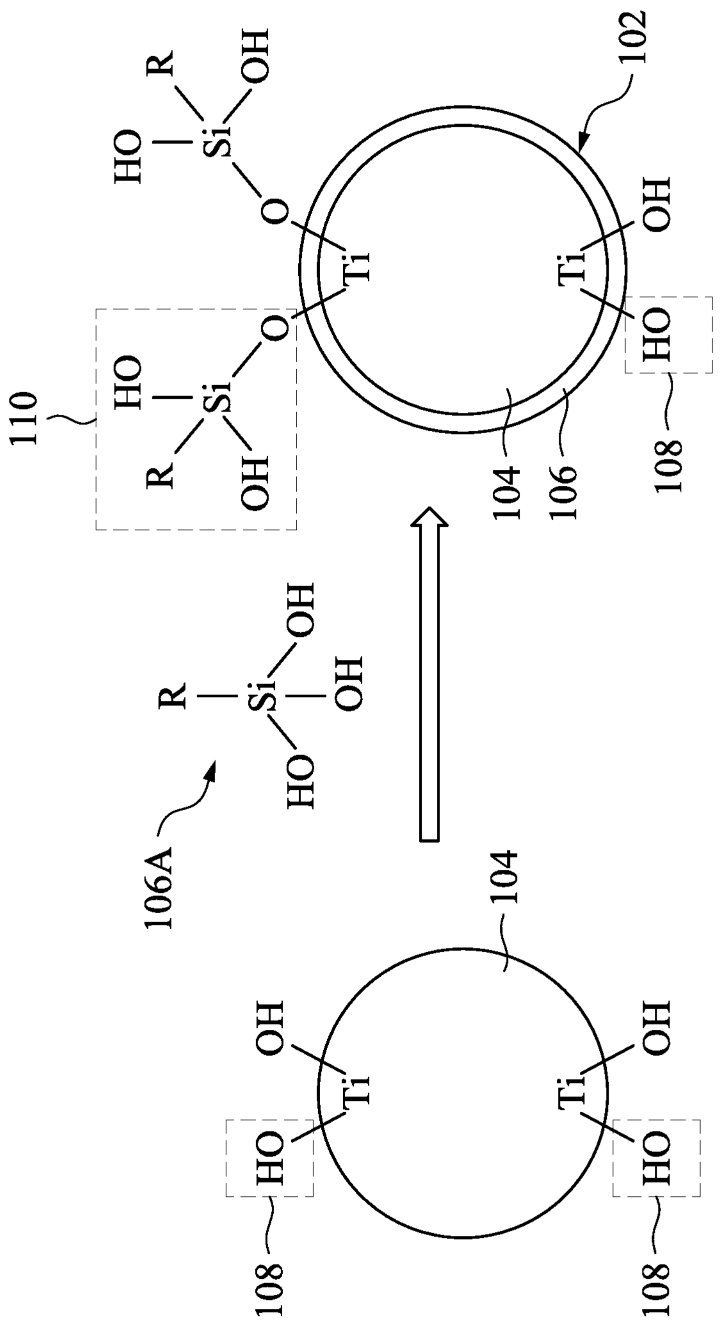

FIG. 1B illustrates a specific embodiment of forming the protective layer 106 over the abrasive particle 104, where the coupling agent 106A is an alkyltrihydroxysilane and the abrasive particle 104 is a titanium dioxide spherical nano-particle. FIG. 1B shows two titanium atoms on the surface of the abrasive particle 104 for illustrative purposes, more than two titanium atoms may be disposed on the surface of the abrasive particle 104. Each titanium atom on the surface of the abrasive particle 104 may be bonded to two first surface functional groups 108, such as hydroxyl groups.

One or both of the first surface functional groups 108 bonded to some of the titanium atoms on the surface of the abrasive particle 104 may react with the coupling agents 106A to form second surface functional groups 110, such as alkyltrihydroxysilane groups. Each second surface functional group 110 bonded to the titanium atom may also be referred to as a protected site. The second surface functional groups 110 may make up the protective layer 106 over the abrasive particle 104. Some other titanium atoms on the surface of the abrasive particle 104 may remain to be bonded to the two first surface functional groups 108. Each first surface functional group 108 bonded to the titanium atom may also be referred to as an unprotected site. A protection ratio R1 of the number of the protected sites to a sum of the number of the protected sites and the number of the unprotected sites on each protected abrasive particle 102 may be in a range from about 10% to about 50%. If the protection ratio R1 is smaller than 10%, the protected abrasive particles 102 may not have sufficient coverage of the protective layers 106 to stay stabilized over an extended period of time, as discussed in greater detail below. If the protection ratio R1 is larger than 50%, a partial or complete removal of the second surface functional groups 110, which may be needed for a subsequent CMP process, may be hindered, as also discussed in greater detail below.

The structure of the second surface functional group 110 may affect the thickness and the functionality of the protective layer 106. The protective layer 106 may have a thickness in a range from about 1 nm to about 2 nm. In the embodiments where the alkyltrihydroxysilane group is used as the second surface functional group 110, the group R may correspond to a straight hydrocarbon chain with a number of carbon atoms being one, two, or three, which may correspond to the second surface functional group 110 being a methyltrihydroxysilane group, an ethyltrihydroxysilane group, or a propyltrihydroxysilane group, respectively. A group R with a higher number of carbon atoms may lead to a protective layer 106 with a larger thickness. If the number of carbon atoms in the group R is higher than 3, the protective layer 106 may have such a large thickness that the partial or complete removal of the second surface functional groups 110, which may be need for a subsequent CMP process, may be hindered, as discussed in greater detail below.

Figure 1C:
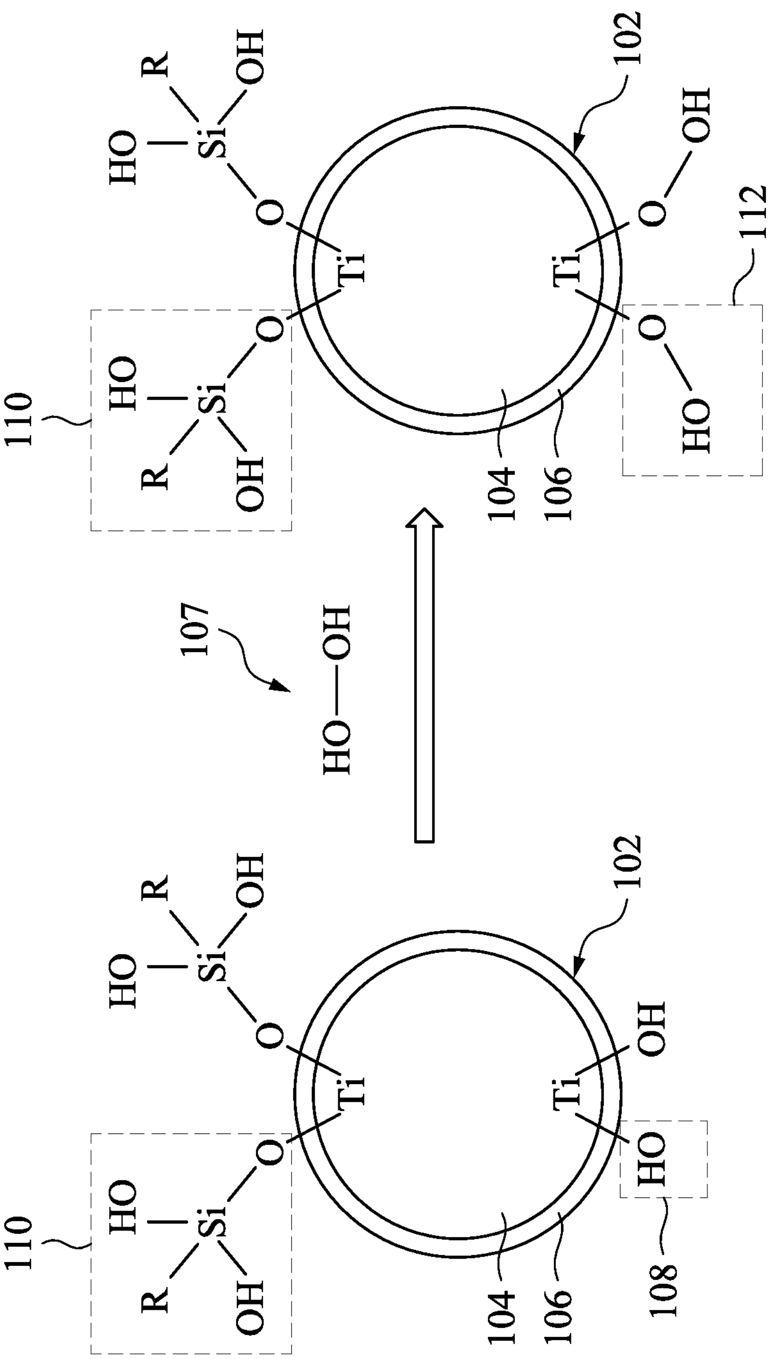

FIG. 1C illustrates a specific embodiment of oxidizing the protected abrasive particle 102 with the oxidizer 107, such as hydrogen peroxide. FIG. 1C shows two titanium atoms on the surface of the protected abrasive particle 102 for illustrative purposes, more than two titanium atoms may be disposed on the surface of the protected abrasive particle 102. Some titanium atoms on the surface of the protected abrasive particle 102 may be bonded to two second surface functional groups 110, such as alkyltrihydroxysilane groups. Some titanium atoms on the surface of the protected abrasive particle 102 may be bonded to two first surface functional groups 108, such as hydroxyl groups. Some titanium atoms (not shown) on the surface of the protected abrasive particle 102 may be bonded to one first surface functional group 108 and one second surface functional group 110. Some first surface functional groups 108 bonded to the titanium atoms on the surface of the protected abrasive particle 102 may react with the oxidizer 107 to form third surface functional groups 112, such as hydroperoxide groups, while some other first surface functional groups 108 and the second surface functional groups 110 bonded to the titanium atoms on the surface of the protected abrasive particle 102 may remain intact. Each third surface functional group 112 bonded to the titanium atom may also be referred to as an oxidized site.

Since hydroperoxide groups are unstable, the oxidized sites on the protected abrasive particles 102 may decay within a short period of time during the storage of the protected abrasive particle solution 100. Since alkyltrihydroxysilane groups are stable, the protected sites on the protected abrasive particles 102 may stay intact for an extended period of time during the storage of the protected abrasive particle solution 100. Therefore, reacting the abrasive particles 104 with the coupling agents 106A to form the protected sites, which may make up the protective layers 106, may stabilize the abrasive particles 104 and prolong shelf life of the protected abrasive particle solution 100 (e.g., longer than 10 days) before being used to form the CMP slurry for a subsequent CMP process as discussed in greater detail below. As a result, cost of forming the CMP slurry and performing the CMP process may be reduced and the efficiency thereof may be increased.

Figure 2A:
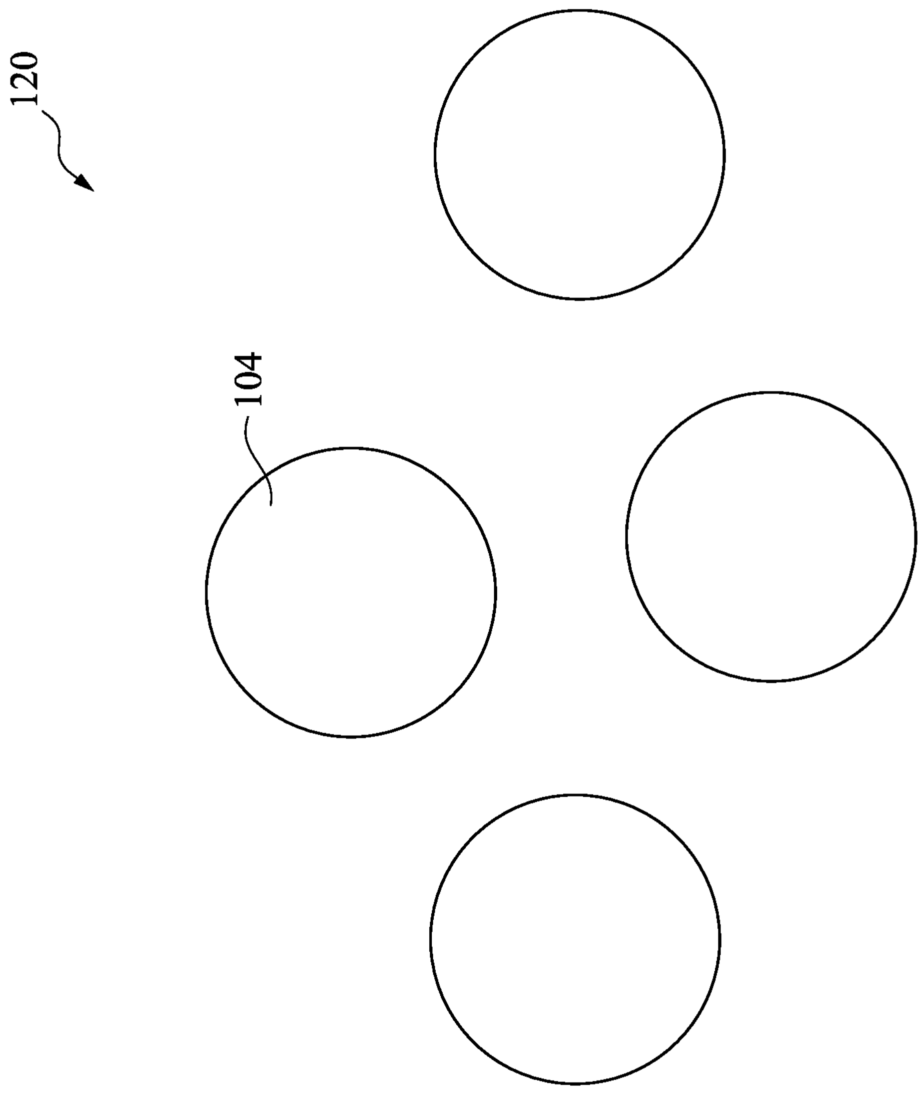
FIGS. 2A-3B illustrates various CMP slurries and the forming of the various CMP slurries, in accordance with some embodiments.

In FIG. 2A, a portion of a first CMP slurry 120 is shown. The first CMP slurry 120 may comprise a plurality of similar abrasive particles 104, the oxidizer 107 (shown in FIG. 2B), such as hydrogen peroxide or the like, an acid 122 (shown in FIG. 2B), such as malic acid or the like, and other common ingredients (not shown), such as surfactant, inhibitor, and solvent, such as water or the like. The concentration of the abrasive particles 104 may be in a range from about 1 wt % to about 5 wt % and the concentration of the oxidizer 107 may be in a range from about 1 wt % to about 3 wt %. The pH value of the first CMP slurry 120 may be in a range from about 8 to about 10, which corresponds to a high concentration of the acid 122. The abrasive particles 104 may be formed when the protected abrasive particle solution 100 is taken out of storage and mixed with other aforementioned ingredients of the first CMP slurry 120, where the acid 122 may react with the protected abrasive particles 102 and completely remove the protective layers 106 over the abrasive particles 104. Then the exposed portions of the abrasive particles 104 may be oxidized by the oxidizer 107. The first CMP slurry 120 may be used during a CMP process to remove conductive materials, as discussed in greater detail below.

Figure 2B:
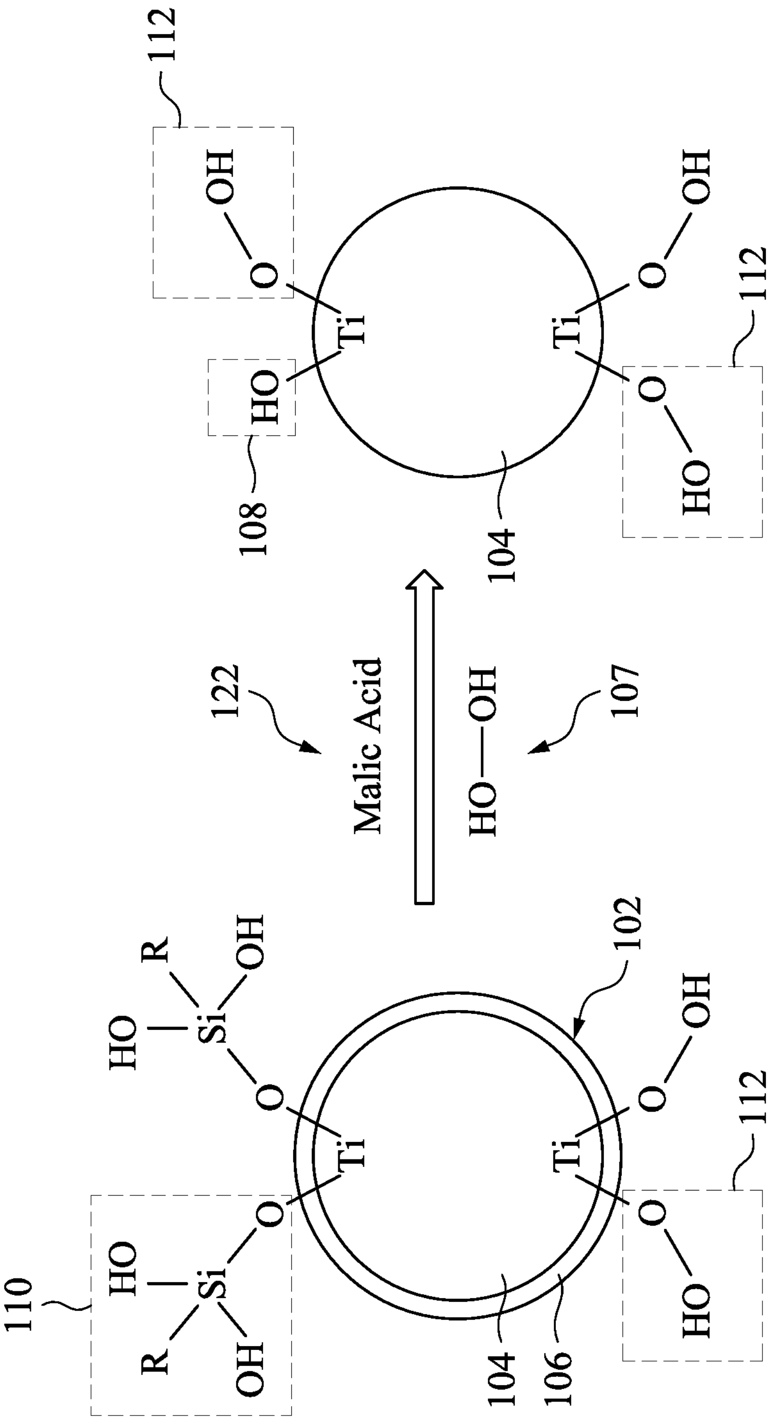

FIG. 2B illustrates a specific embodiment of forming the abrasive particle 104 by completely removing the protective layer 106 from the protected abrasive particle 102 and further oxidizing the abrasive particle 104, when the protected abrasive particle solution 100 is taken out of storage and mixed with other aforementioned ingredients of the first CMP slurry 120. In this embodiment, the abrasive particle 104 is a titanium dioxide spherical nano-particle. FIG. 2B shows two titanium atoms on the surface of the protected abrasive particle 102 for illustrative purposes, more than two titanium atoms may be disposed on the surface of the abrasive particle 104. Some titanium atoms on the surface of the protected abrasive particle 102 may be bonded to two second surface functional groups 110, such as alkyltrihydroxysilane groups. Some titanium atoms on the surface of the protected abrasive particle 102 may be bonded to two third surface functional groups 112, such as hydroperoxide groups. Some titanium atoms (not shown) on the surface of the protected abrasive particle 102 may be bonded to two first surface functional groups 108, such as hydroxyl groups. Some titanium atoms (not shown) on the surface of the protected abrasive particle 102 may be bonded to one first surface functional group 108 and one second surface functional group 110. Some titanium atoms (not shown) on the surface of the protected abrasive particle 102 may be bonded to one first surface functional group 108 and one third surface functional groups 112. Some titanium atoms (not shown) on the surface of the protected abrasive particle 102 may be bonded to one second surface functional group 110 and one third surface functional groups 112.

All of the second surface functional groups 110 bonded to the titanium atoms on the surface of the protected abrasive particle 102 may react with the acid 122 to form first surface functional groups 108. As a result, the protective layer 106 may be completely removed from the protected abrasive particle 102. Then some of the first surface functional groups 108 bonded to the titanium atoms on the surface of the abrasive particle 104 may react with the oxidizer 107 to form third surface functional groups 112. As a result, first surface functional groups 108 and third surface functional groups 112 may bonded to the surface of the abrasive particle 104 in the first CMP slurry 120. Some titanium atoms on the surface of the abrasive particle 104 may be bonded to two third surface functional groups 112. Some titanium atoms (not shown) on the surface of the abrasive particle 104 may be bonded to two first surface functional groups 108. Some titanium atoms on the surface of the abrasive particle 104 may be bonded to one first surface functional group 108 and one third surface functional group 112.

Figure 3A:
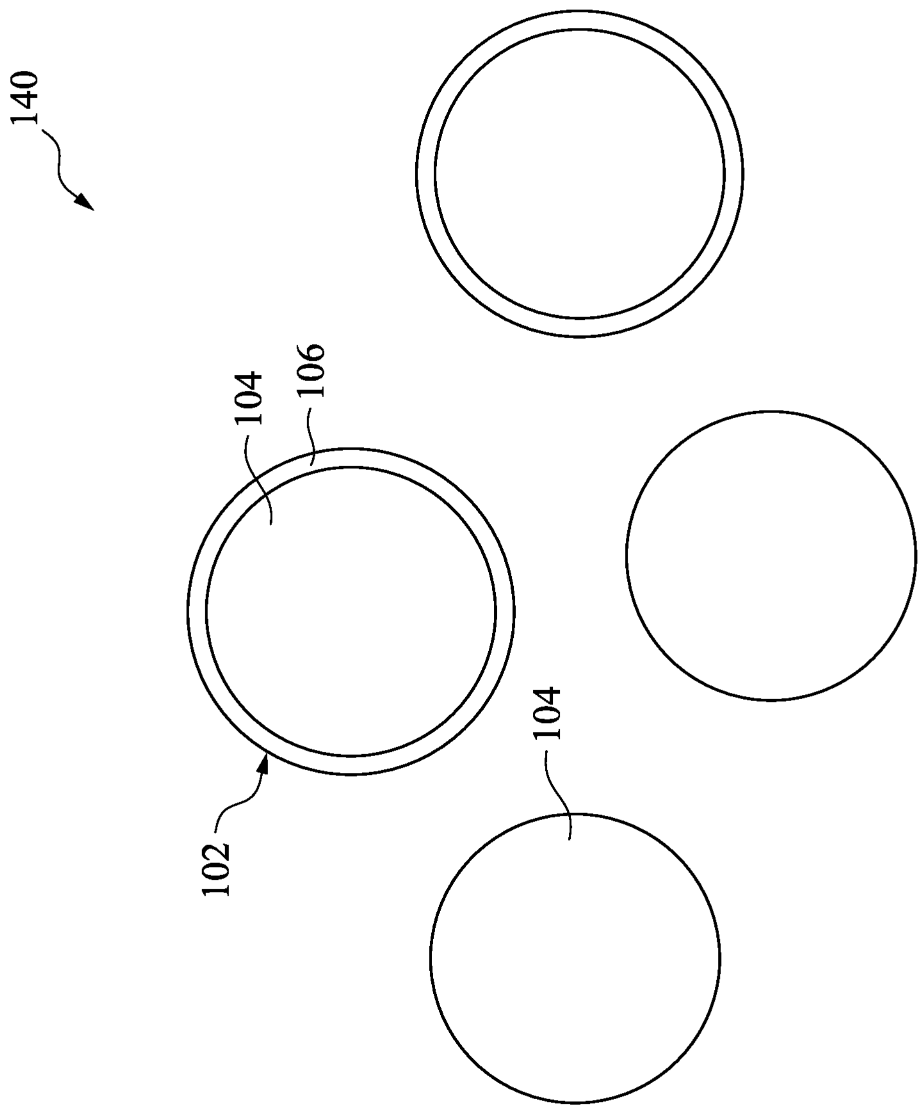

In FIG. 3A, a portion of a second CMP slurry 140 is shown. The second CMP slurry 140 may comprise a plurality of similar abrasive particles 104, a plurality of similar protected abrasive particles 102, the oxidizer 107 (shown in FIG. 3B), such as hydrogen peroxide or the like, the acid 122 (shown in FIG. 3B), such as malic acid or the like, and other common ingredients (not shown), such as surfactant, inhibitor, and solvent, such as water or the like. The concentration of the abrasive particles 104 may be in a range from about 1 wt % to about 5 wt % and the concentration of the oxidizer 107 may be in a range from about 1 wt % to about 3 wt %. The pH value of the second CMP slurry 140 may be in a range from about 10 to about 12, which correspond to a low concentration of the acid 122. The pH value of the second CMP slurry 140 may be larger than the pH value of the first CMP slurry 120 and the concentration of the acid 122 in the second CMP slurry 140 may be lower than the concentration of the acid 122 in the first CMP slurry 120. As a result, the protective layers 106 on all of the protected abrasive particles 102 are removed when the first CMP slurry 120 is mixed, while the protective layers 106 on some of the protected abrasive particles 102 are removed when the second CMP slurry 140 is mixed, thereby resulting in different functionalities of the first CMP slurry 120 and the second CMP slurry 140, as discussed in greater detail below. The abrasive particles 104 may have a same structure and may be formed in by a same method as the abrasive particles 104 described with respect with FIGS. 2A and 2B.

The protected abrasive particles 102 may have a protection ratio R2, which may be smaller than the protection ratio R1 described with respect with FIGS. 1B. The protected abrasive particles 102 with the protection ratio R2 may be formed when the protected abrasive particle solution 100 is taken out of storage and mixed with other aforementioned ingredients of second CMP slurry 140, where the acid 122 may react with the protected abrasive particles 102 with the protection ratio R1 and partially remove the protective layers 106 over the abrasive particles 104. Then the exposed portions of the abrasive particles 104 may be oxidized by the oxidizer 107. The second CMP slurry 140 may be used during a CMP process to remove conductive and dielectric materials, as discussed in greater detail below.

Figure 3B:
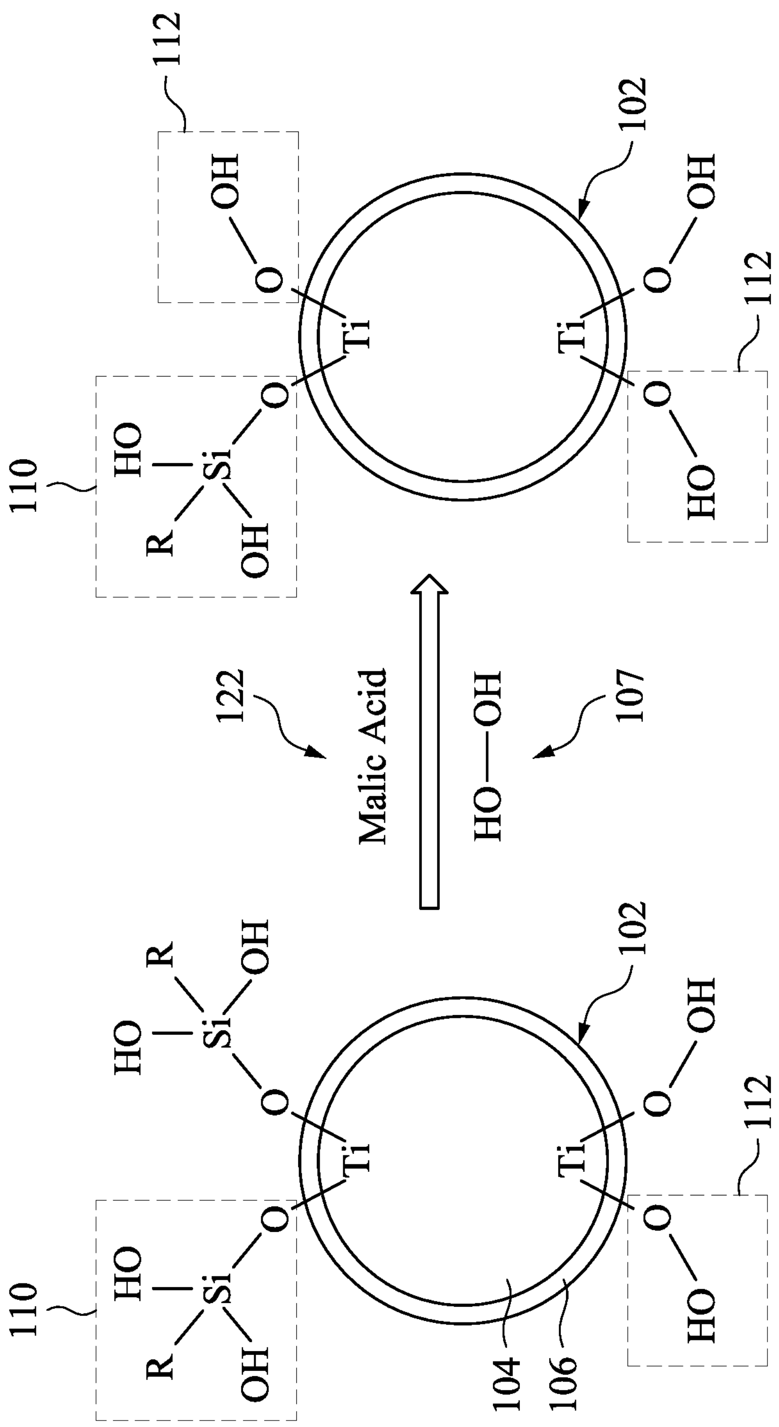

FIG. 3B illustrates a specific embodiment of forming protected abrasive particles 102 with the protection ratio R2 by partially removing the protective layer 106 from the protected abrasive particles 102 with the protection ratio R1 and further oxidizing the protected abrasive particle 102, when the protected abrasive particle solution 100 is taken out of storage and mixed with other aforementioned ingredients of the second CMP slurry 140. In this embodiment, the abrasive particle 104 is a titanium dioxide spherical nano-particle. FIG. 3B shows two titanium atoms on the surface of the protected abrasive particle 102 for illustrative purposes, more than two titanium atoms may be disposed on the surface of the abrasive particle 104. Some titanium atoms on the surface of the protected abrasive particle 102 may be bonded to two third surface functional groups 112, such as hydroperoxide groups. Some titanium atoms on the surface of the protected abrasive particle 102 may be bonded to two second surface functional groups 110, such as alkyltrihydroxysilane groups. Some titanium atoms (not shown) on the surface of the protected abrasive particle 102 may be bonded to two first surface functional groups 108, such as hydroxyl groups. Some titanium atoms (not shown) on the surface of the protected abrasive particle 102 may be bonded to one first surface functional group 108 and one second surface functional group 110. Some titanium atoms (not shown) on the surface of the protected abrasive particle 102 may be bonded to one first surface functional group 108 and one third surface functional group 112. Some titanium atoms (not shown) on the surface of the protected abrasive particle 102 may be bonded to one second surface functional group 110 and one third surface functional group 112.

Some of the second surface functional groups 110 bonded to the titanium atoms on the surface of the protected abrasive particle 102 may react with the acid 122 to form first surface functional groups 108, while some of the second surface functional groups 110 bonded to the titanium atoms on the surface of the protected abrasive particle 102 may remain intact. As a result, the protective layer 106 may be partially removed from the protected abrasive particle 102. Then some of the first surface functional groups 108 bonded to the titanium atoms on the surface of the protected abrasive particle 102 may react with the oxidizer 107 to form third surface functional groups 112. As a result, first surface functional groups 108, second surface functional groups 110, and third surface functional groups 112 may bonded to the surface of the protected abrasive particle 102 in the second CMP slurry 140. Some titanium atoms on the surface of the protected abrasive particle 102 may be bonded to two third surface functional groups 112. Some titanium atoms (not shown) on the surface of the protected abrasive particle 102 may be bonded to two second surface functional groups 110. Some titanium atoms (not shown) on the surface of the protected abrasive particle 102 may be bonded to two first surface functional groups 108. Some titanium atoms (not shown) on the surface of the abrasive particle 104 may be bonded to one first surface functional group 108 and one third surface functional group 112. Some titanium atoms (not shown) on the surface of the abrasive particle 104 may be bonded to one first surface functional group 108 and one second surface functional group 110. Some titanium atoms on the surface of the abrasive particle 104 may be bonded to one second surface functional group 110 and one third surface functional group 112.

Figure 4A:
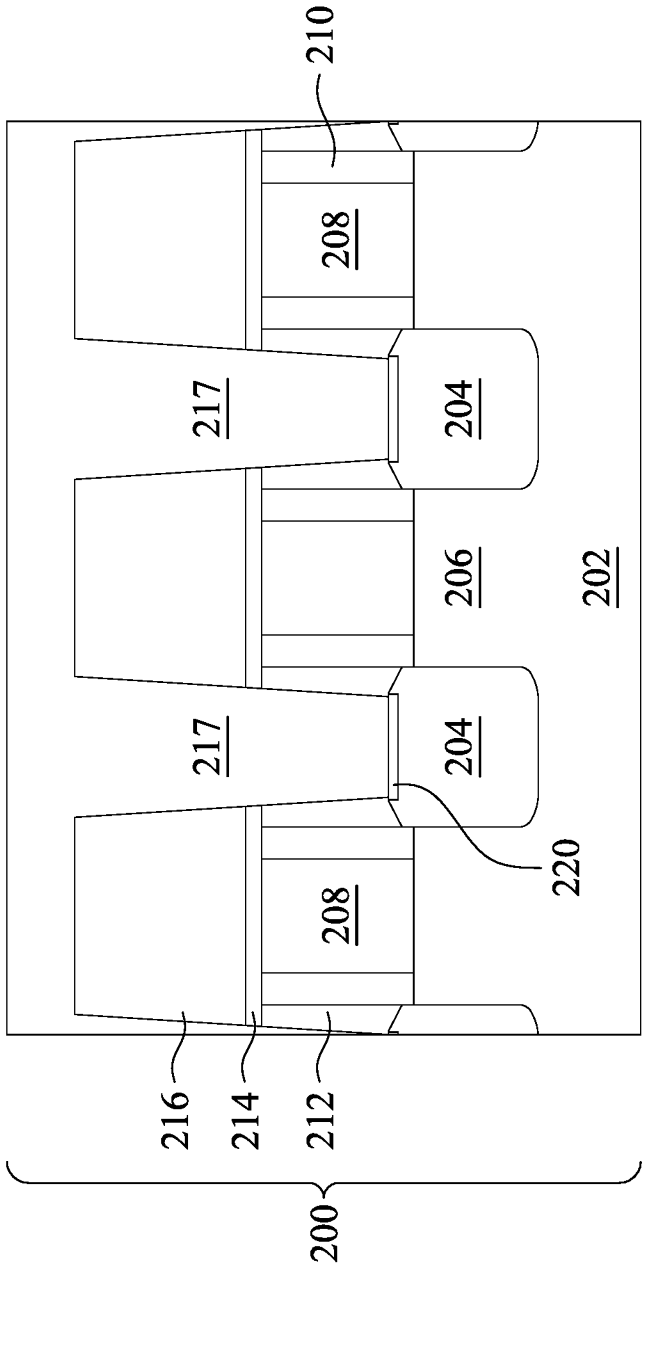
FIGS. 4A-5D illustrate various CMP processes and results on a work piece, in accordance with some embodiments.

FIG. 4A shows a work piece 200, which may be an integrated circuit die or device including a transistor, such as fin field-effect transistor (FinFET), nanowire FET, complementary FET (CFET), or the like. The work piece 200 may include a substrate 202, source/drain regions 204 in the substrate 202, channel regions 206 in the substrate 202 and between neighboring source/drain regions 204, gate stacks 208 over the channel regions 206, and gate spacers 210 along sidewalls of the gate stacks 208. The work piece 200 may further include a first interlayer dielectric (ILD) 212 over the source/drain regions 204 and between neighboring gate stacks 208, a first etch stop layer (ESL) 214 on top surfaces of the gate stacks 208, the gate spacers 210, and the first ILD 212, a second ILD 216 on the ESL 214, and a source/drain contact layer 217 on the source/drain contact layer 217, wherein portions of the second ILD 216 may extend through the second ILD 216, the ESL 214, and the first ILD 212 to contact the underlying source/drain regions 204. Silicide regions 220 may be disposed between the portions of the second ILD 216 and the source/drain regions 204. The second ILD 216 may comprise a dielectric material, such as silicon dioxide, phospho-silicate glass (PSG), boro-silicate glass (BSG), boron-doped phospho-silicate glass (BPSG), undoped silicate glass (USG), or the like. The source/drain contact layer 217 may comprise a conductive material, such as ruthenium, tungsten, copper, aluminum, cobalt, titanium, titanium nitride, tantalum, tantalum nitride, tantalum carbide or the like.

Figure 4B:
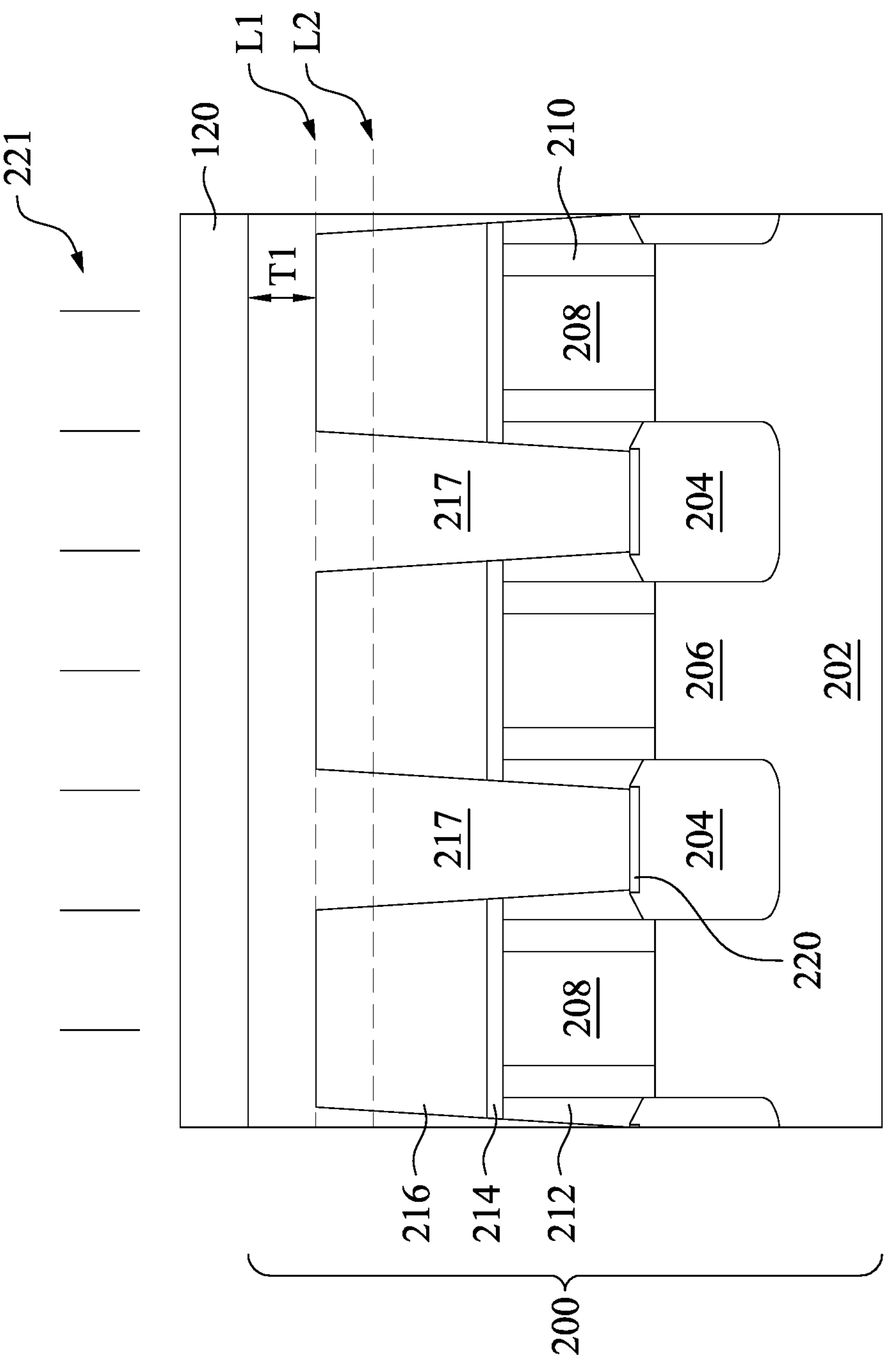

In FIG. 4B, a first CMP process is done on a top surface of the work piece 200, which is also a top surface of the source/drain contact layer 217. The first CMP process maybe referred to as a bulk polishing process. The first CMP process may stop at a top surface of the second ILD 216, which may be at a first level L1. As a result, a layer of the conductive material of the source/drain contact layer 217 with a thickness T1 may be removed and the source/drain contact layer 217 may be separated into source/drain contacts 218 (shown in FIG. 4C). In some embodiments, the thickness T1 is in a range from about 50 nm to about 100 nm. The first CMP slurry 120 may be applied on the top surface of the work piece 200 and used to perform the first CMP process. The ingredients of the first CMP slurry 120 may generate highly reactive free radicals, which may oxidize and soften the conductive material of the source/drain contact layer 217. The quantity of the free radicals in the first CMP slurry 120 may be proportional to the removal rate of the conductive material of the source/drain contact layer 217. Optical radiation 221 may be applied on the first CMP slurry 120 to increase the quantity of the free radicals generated by the first CMP slurry 120, which may result in a higher removal rate of the conductive material of the source/drain contact layer 217. Then the oxidized and softened portion of the source/drain contact layer 217 is removed by the abrasive particles 104 and a polishing pad via grinding as described in greater details below. Due to the spherical shapes of the abrasive particles 104, scratches that may be left on the top surface of the work piece 200 at the first level L1 may be eliminated or reduced.

In a specific embodiment where the abrasive particles 104 are the titanium dioxide spherical nano-particles as described with respect to FIG. 2B, the free radicals may be generated by two mechanisms. The first mechanism may be a decay of the unstable third surface functional groups 112, such as hydroperoxide groups, on the surface of the abrasive particles 104 that produces hydroxyl radicals. The second mechanism may be reactions between the hydroxide ions in the first CMP slurry 120 and holes in the conduction band of the abrasive particles 104, which may be created by the optical radiation 221 absorbed by the abrasive particles 104. The optical radiation 221 may comprise ultra-violet radiation in a wavelength range from about 200 nm to about 400 nm as well as visible radiation in a wavelength range from about 400 nm to about 750 nm. As discussed above, some abrasive particles 104 may have anatase crystalline structures and some abrasive particles 104 may have rutile crystalline structures. The abrasive particles 104 with anatase crystalline structures may have a higher capability to absorb the optical radiation 221 than the abrasive particles 104 with rutile crystalline structures, so a higher ratio of the number of abrasive particles 104 with anatase crystalline structures to the number of abrasive particles 104 with rutile crystalline structures may increase the quantity of the free radicals generated in the first CMP slurry 120, thereby increasing the removal rate of the conductive material of the source/drain contact layer 217.

The conductive material of the source/drain contact layer 217 may be ruthenium, tungsten, or copper, which may correspond to removal rates of the conductive material of the source/drain contact layer 217 by the first CMP slurry 120 under the optical radiation 221 in ranges from about 108 nm/min to about 132 nm/min, from about 17 nm/min to about 21 nm/min, or from about 12 nm/min to about 14 nm/min, respectively. The removal of ruthenium, tungsten, or copper by the first CMP slurry 120 under the optical radiation 221 may not generate any toxic product. The dielectric material of the second ILD 216 may be silicon dioxide, which may correspond to a removal rate of the dielectric material of the second ILD 216 by the first CMP slurry 120 under the optical radiation 221 in a range from about 3.5 nm/min to about 4.3 nm/min, which may be substantially lower than the removal rates of the conductive material of the source/drain contact layer 217. Therefore, the first CMP slurry 120 may be used for selectively removing a layer of the conductive material of the source/drain contact layer 217 and stopping at the top surface of the second ILD 216.

Figure 4C:
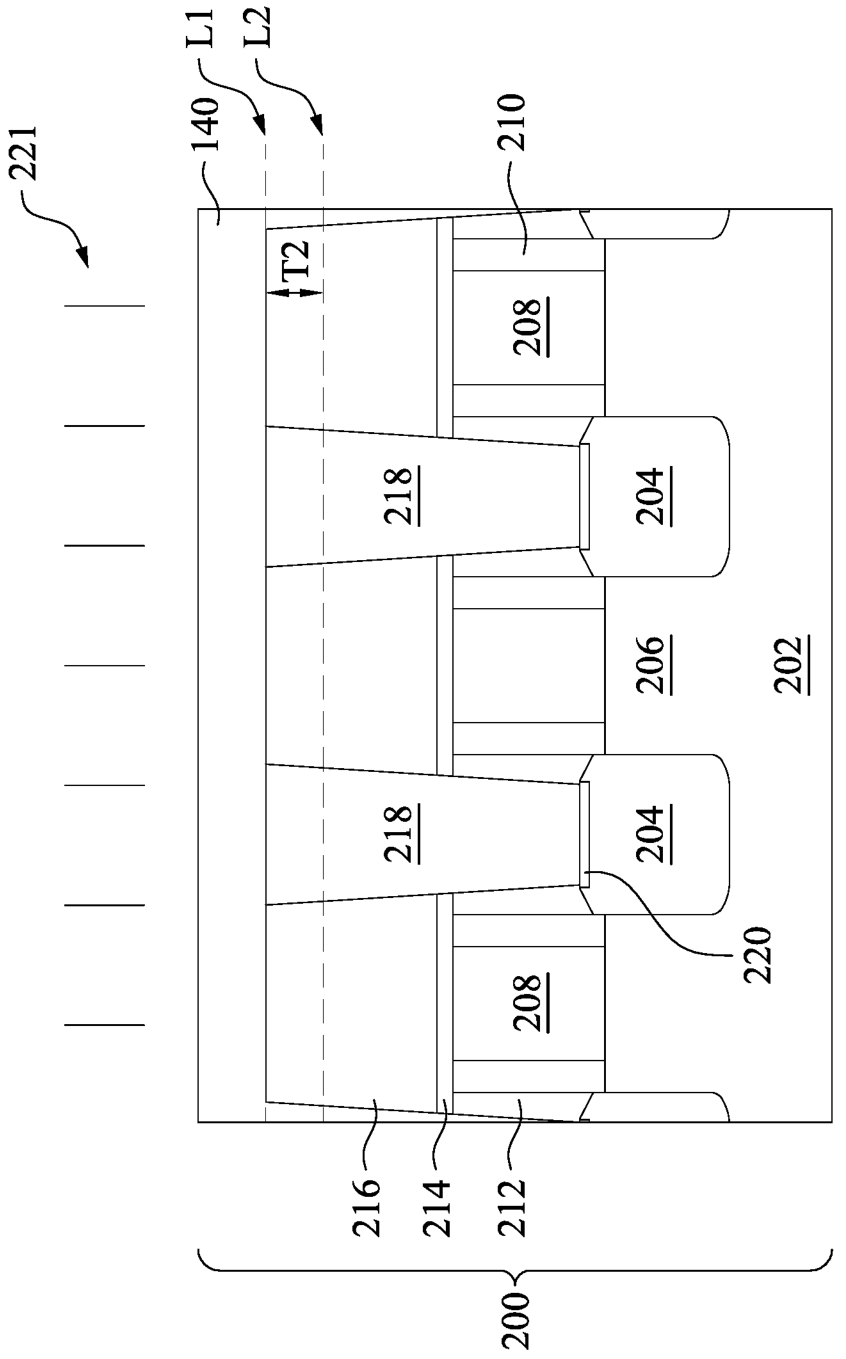

In FIG. 4C, a second CMP process is done on the top surface of the work piece 200 at the first level L1, which comprises top surfaces of the source/drain contacts 218 and the second ILD 216. The second CMP process maybe referred to as a buff polishing process. The second CMP process may be timed and stop at a second level L2. As a result, the source/drain contacts 218 and the second ILD 216 may be reduced by a thickness T2. In some embodiments, the thickness T2 is in a range from about 25 nm to about 35 nm. The second CMP slurry 140 may be applied on the top surface of the work piece 200 and used to perform the second CMP process. The conductive material of the source/drain contacts 218 may be removed via the same or similar mechanisms by the abrasive particles 104 in the second CMP slurry 140 under the optical radiation 221 as described with respect to the first CMP slurry 120. The dielectric material of the second ILD 216 may be removed by the protected abrasive particles 102 in the second CMP slurry 140. The remaining second surface functional groups 110 on the protected abrasive particles 102 may react with the dielectric material of the second ILD 216, which may result in the softening of the dielectric material of the second ILD 216. Then the softened portion of the second ILD 216 is removed by the protected abrasive particles 102, the abrasive particles 104, and a polishing pad via grinding as described in greater details below.

The conductive material of the source/drain contacts 218 may be ruthenium, tungsten, or copper, and a removal rate of the conductive material of the source/drain contacts 218 by the second CMP slurry 140 under the optical radiation 221 may be in a range from about 10 nm/min to about 15 nm/min. The removal of ruthenium, tungsten, or copper by the second CMP slurry 140 under the optical radiation 221 may not generate any toxic product. The dielectric material of the second ILD 216 may be silicon dioxide, and a removal rate of the dielectric material of the second ILD 216 by the second CMP slurry 140 under the optical radiation 221 may be in a range from about 10 nm/min to about 15 nm/min, which may be similar to the removal rate of the conductive material of the source/drain contacts 218. Therefore, the second CMP slurry 140 may be used for removing both the source/drain contacts 218 and the second ILD 216.

Figure 4D:
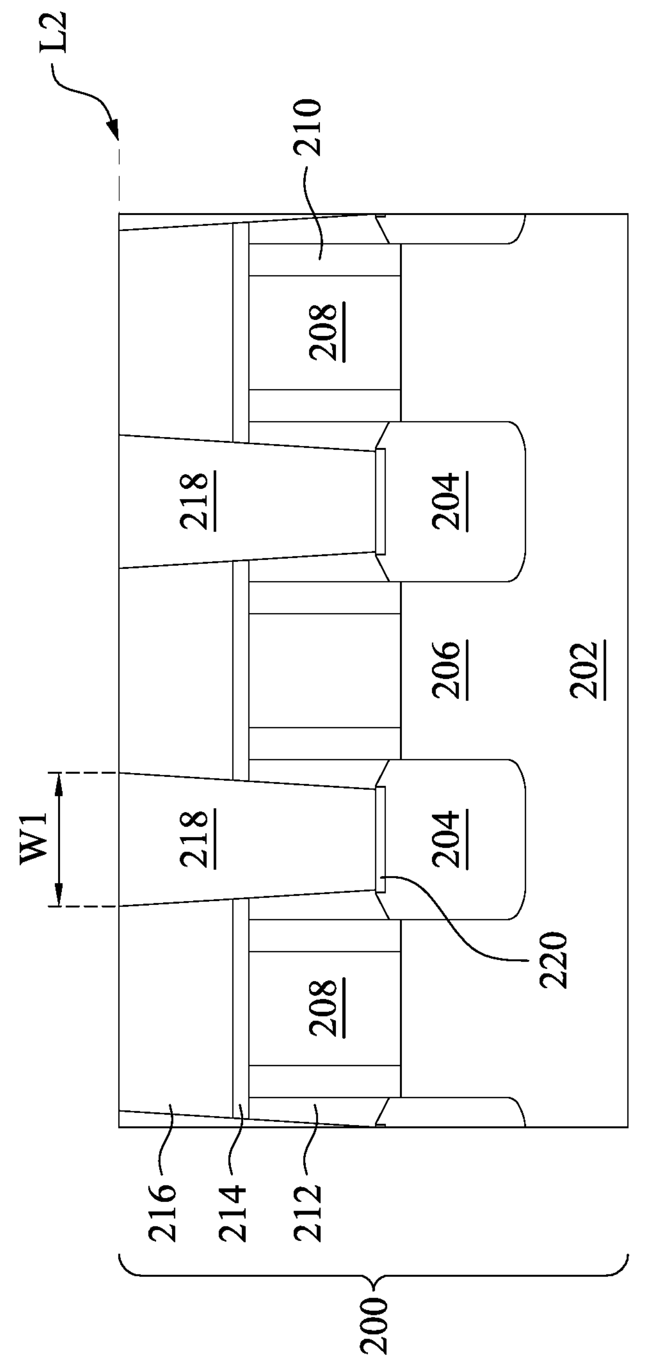

In FIG. 4D, a structure of the work piece 200 after the second CMP process is shown. Due to the spherical shapes of the protected abrasive particles 102 and the abrasive particles 104. scratches that may be left on the top surface of the work piece 200 at the second level L2 may be eliminated or reduced. The work piece 200 may have a planarized top surface where the top surfaces of the source/drain contacts 218 and the top surface of the second ILD 216 may be coplanar, which may be a result of the removal rate of the dielectric material of the second ILD 216 by the second CMP slurry 140 being similar to the removal rate of the conductive material of the source/drain contacts 218 by the second CMP slurry 140. Each source/drain contacts 218 may have a width W1 at the second level L2 in a range from about 11 nm to about 30 nm.

Figure 5A:
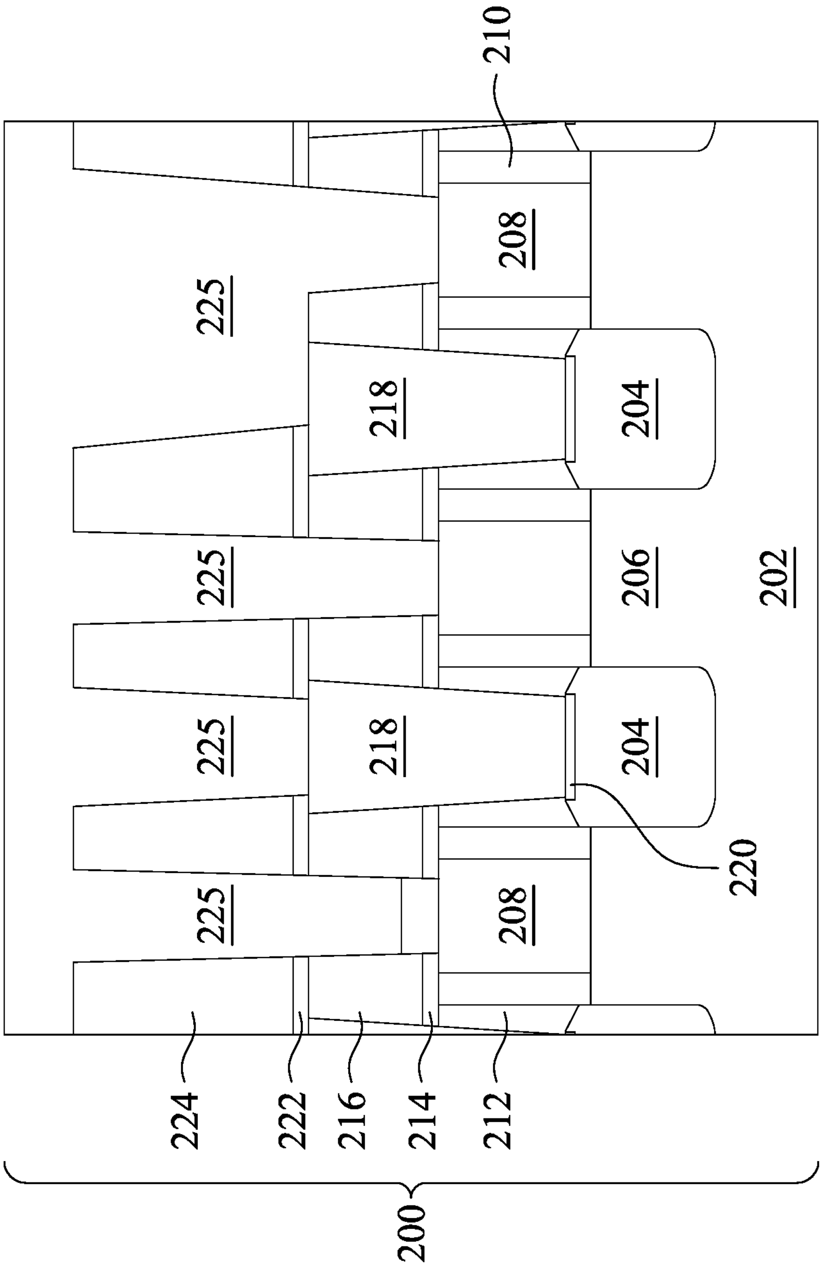

In FIG. 5A, a second ESL 222 is formed on the planarized top surfaces of the source/drain contacts 218 and the second ILD 216, and a first inter-metal dielectric (IMD) 224 is formed on the second ESL 222. Then a conductive contact layer 225 is formed on the second ESL 222, wherein portions of the conductive contact layer 225 may extend through the first IMD 224 and the second ESL 222 to contact the underlying source/drain contacts 218, portions of the conductive contact layer 225 may extend through the first IMD 224, the second ESL 222, the second ILD 216, and the first ESL 214 to contact the underlying gate stacks 208, and portions of the conductive contact layer 225 may extend through the first IMD 224, the second ESL 222, the second ILD 216, and the first ESL 214 to contact both the underlying gate stacks 208 and source/drain contacts 218. The first IMD 224 may comprise similar materials as the second ILD 216. The conductive contact layer 225 may comprise similar materials as the source/drain contact layer 217.

Figure 5B:
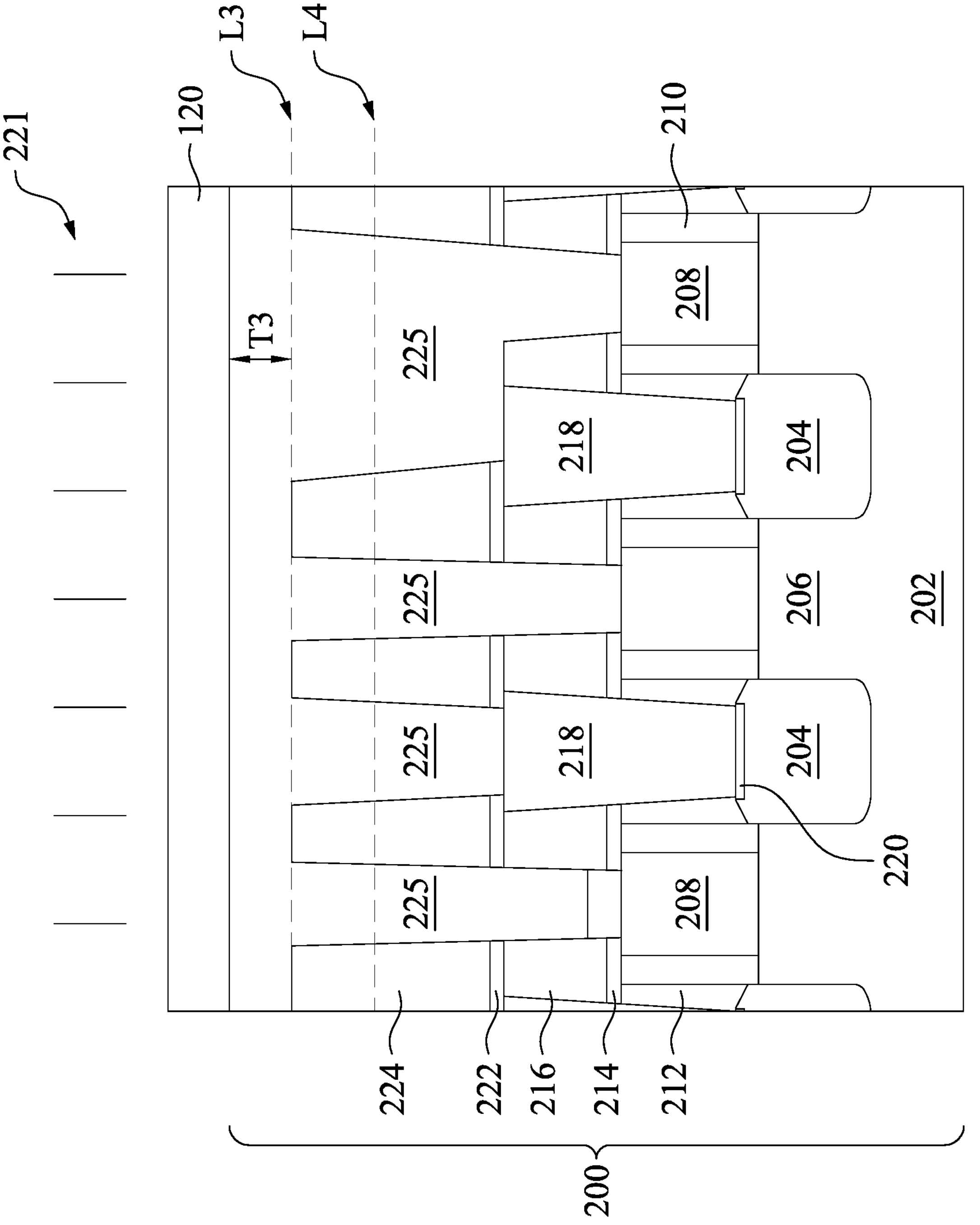

In FIG. 5B, a third CMP process is done on the top surface of the work piece 200, which is also a top surface of the conductive contact layer 225. The third CMP process maybe referred to as a bulk polishing process. The third CMP process may stop at a top surface of the first IMD 224, which may be at a third level L3. As a result, a layer of the conductive material of the conductive contact layer 225 with a thickness T3 may be removed and the conductive contact layer 225 may be separated into gate contacts 226, a first conductive contact 228, and a second conductive contact 230 (shown in FIG. 5C). In some embodiments, the thickness T3 is in a range from about 10 nm to about 50 nm. The first CMP slurry 120 may be applied on the top surface of the work piece 200 and used to perform the third CMP process. The conductive material of the conductive contact layer 225 may be removed via the same or similar mechanisms by the abrasive particles 104 in the first CMP slurry 120 under the optical radiation 221 as the conductive material of the source/drain contacts 218, as described with respect to FIG. 4B. The first CMP slurry 120 may be used for selectively removing a layer of the conductive contact layer 225 and stopping at the top surface of the first IMD 224. Due to the spherical shapes of the abrasive particles 104, scratches that may be left on the top surface of the work piece 200 at the third level L3 may be eliminated or reduced.

Figure 5C:
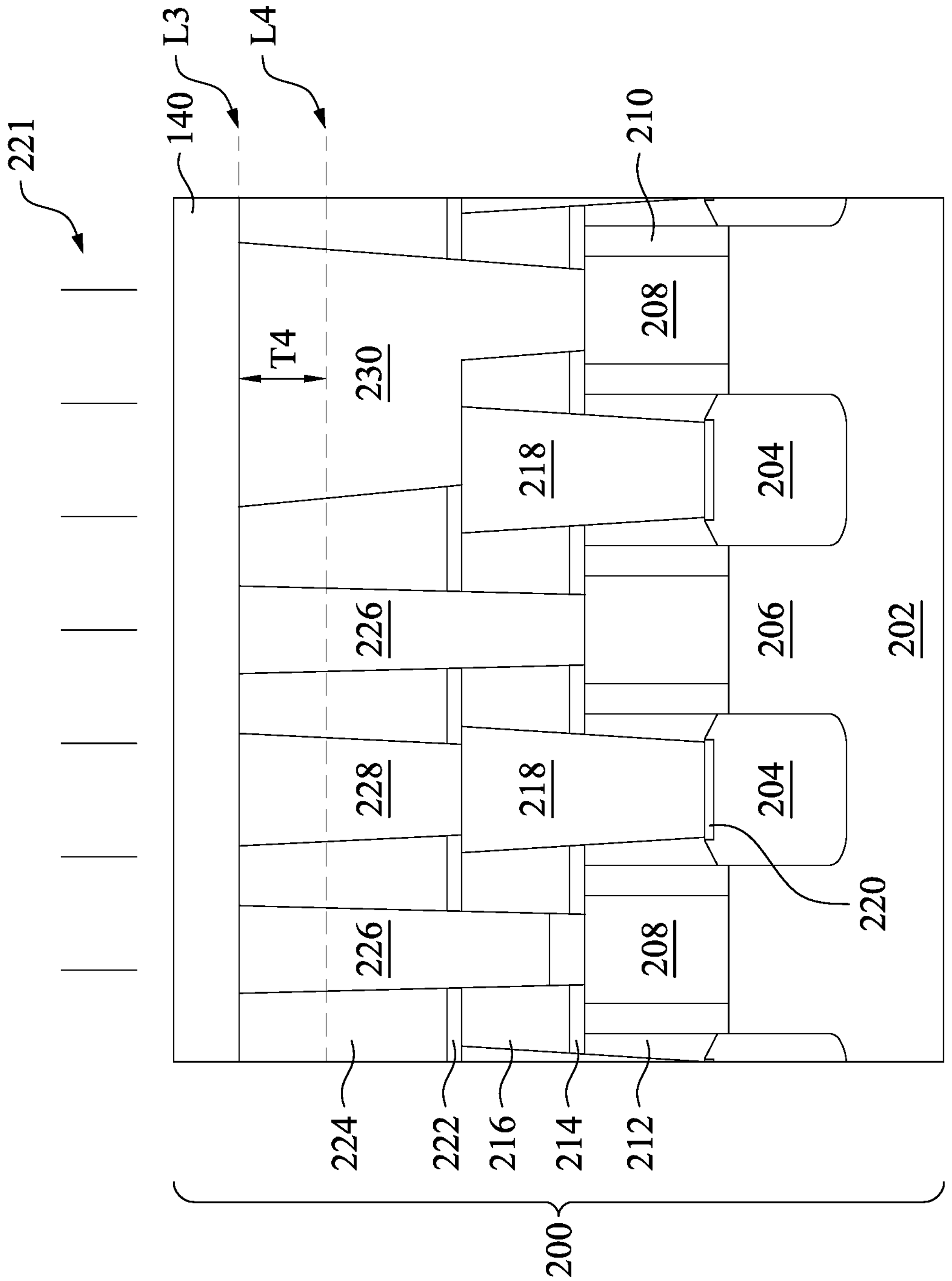

In FIG. 5C, a fourth CMP process is done on the top surface of the work piece 200 at the third level L3, which comprises top surfaces of the gate contacts 226, the first conductive contact 228, the second conductive contact 230, and the first IMD 224. The fourth CMP process maybe referred to as a buff polishing process. The fourth CMP process may be timed and stop at a fourth level L4. As a result, the gate contacts 226, the first conductive contact 228, the second conductive contact 230, and the first IMD 224 may be reduced by a thickness T4. In some embodiments, the thickness T4 is in a range from about 18 nm to about 32 nm. The second CMP slurry 140 may be applied on the top surface of the work piece 200 and used to perform the fourth CMP process. The conductive material of the gate contacts 226, the first conductive contact 228, and the second conductive contact 230 may be removed via the same or similar mechanisms by the abrasive particles 104 in the second CMP slurry 140 under the optical radiation 221 as the conductive material of the source/drain contacts 218, as described with respect to FIG. 4C. The first IMD 224 may be removed via the same or similar mechanisms by protected abrasive particles 102 in the second CMP slurry 140 as the dielectric material of the second ILD 216, as described with respect to FIG. 4C.

Figure 5D:
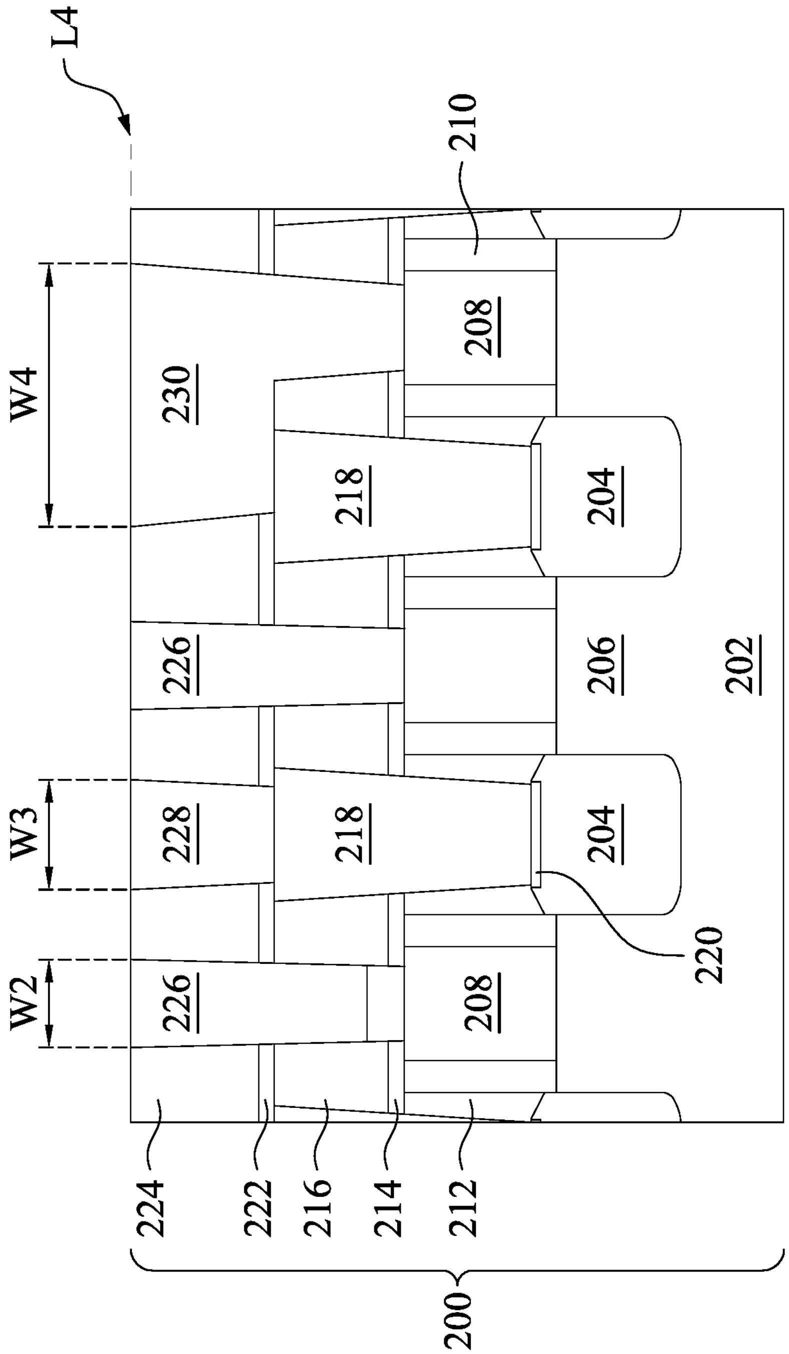

In FIG. 5D, a structure of the work piece 200 after the fourth CMP process is shown. Due to the spherical shapes of the protected abrasive particles 102 and the abrasive particles 104, scratches that may be left on the top surface of the work piece 200 at the fourth level L4 may be eliminated or reduced. The work piece 200 may have a planarized top surface where the top surfaces of the gate contacts 226, the first conductive contact 228, the second conductive contact 230, and the first IMD 224 may be coplanar, which may be a result of the removal rates of the dielectric material of the first IMD 224 by the second CMP slurry 140 being similar to the removal rate of the conductive material of the gate contacts 226, the first conductive contact 228, and the second conductive contact 230 by the second CMP slurry 140. Each gate contact 226 may have a width W2 at the fourth level LA in a range from about 11 nm to about 14 nm. The first conductive contact 228 may have a width W3 at the fourth level L4 in a range from about 11 nm to about 14 nm. The second conductive contact 230 may have a width W4 at the fourth level L4 in a range from about 11 nm to about 30 nm.

Figure 6:
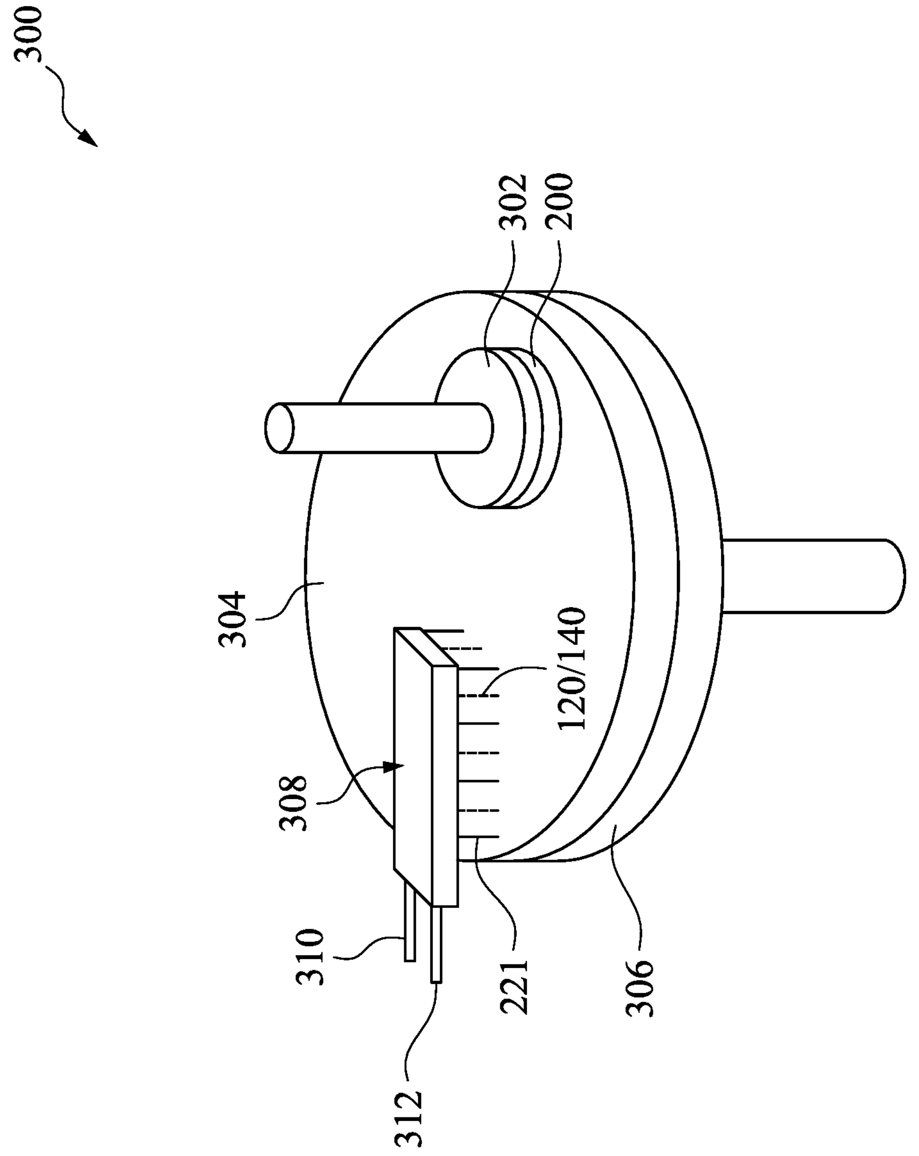
FIGS. 6-8B illustrate a CMP system, in accordance with some embodiments.

FIG. 6 shows a CMP system 300 which may be used to carry out the first, the second, the third, and the fourth CMP processes. The work piece 200 may be loaded into the CMP system 300 and connected to a carrier 302, which faces the source/drain contact layer 217 or conductive contact layer 225 towards a polishing pad 304 connected to a platen 306. For the first and the third CMP processes (bulk polishing processes), the polishing pad 304 may be a hard polishing pad. For the second and the fourth CMP processes (buff polishing processes), the polishing pad 304 may be a soft polishing pad. During each aforementioned CMP process, the carrier 302 may press the surface of the work piece 200 against the polishing pad 304. The work piece 200 and the polishing pad 304 are each rotated against each other, either in the same direction or in opposite directions. By rotating the polishing pad 304 and the work piece 200 against each other, the polishing pad 304 mechanically grinds away the materials that are in contact with the polishing pad 304. The carrier 302 may also move the work piece 200 back and forth along a radius of the polishing pad 304.

The mechanical grinding of the polishing pad 304 may be accompanied by use of first CMP slurry 120 or the second CMP slurry 140, which may be dispensed onto the polishing pad 304 through a slurry arm 308. The optical radiation 221 may be applied on the first CMP slurry 120 or the second CMP slurry 140 by the slurry arm 308 also. As described above, the first CMP slurry 120 and the second CMP slurry 140 may react with and soften conductive and dielectric materials that are in contact with the first CMP slurry 120 and the second CMP slurry 140. Also the first CMP slurry 120 may contain abrasive particles 104 and the second CMP slurry 140 may contain abrasive particles 104 and protected abrasive particles 102, which may assist with the mechanical grinding of the polishing pad 304. The slurry arm 308 may include a slurry line 310, which may supply the first CMP slurry 120 or the second CMP slurry 140 to the slurry arm 308, and a water line 312 which may supply water for rinsing or cleaning.

Figure 7A:
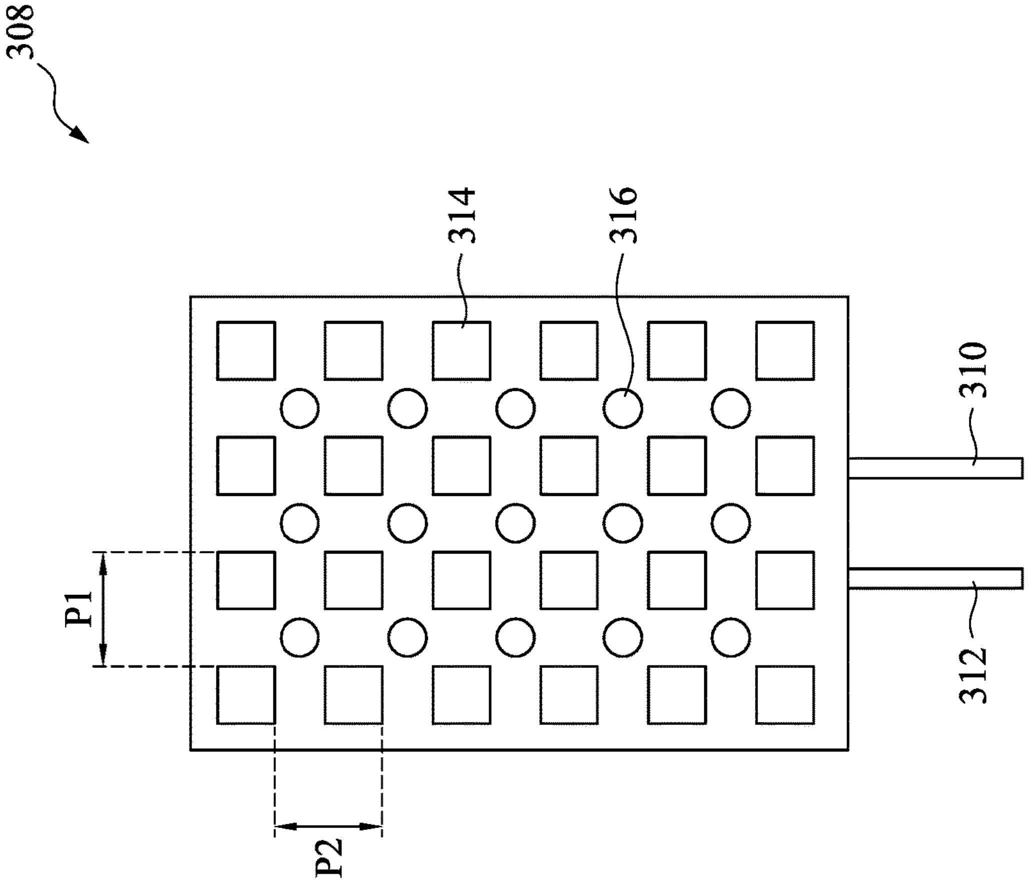
Figure 7B:
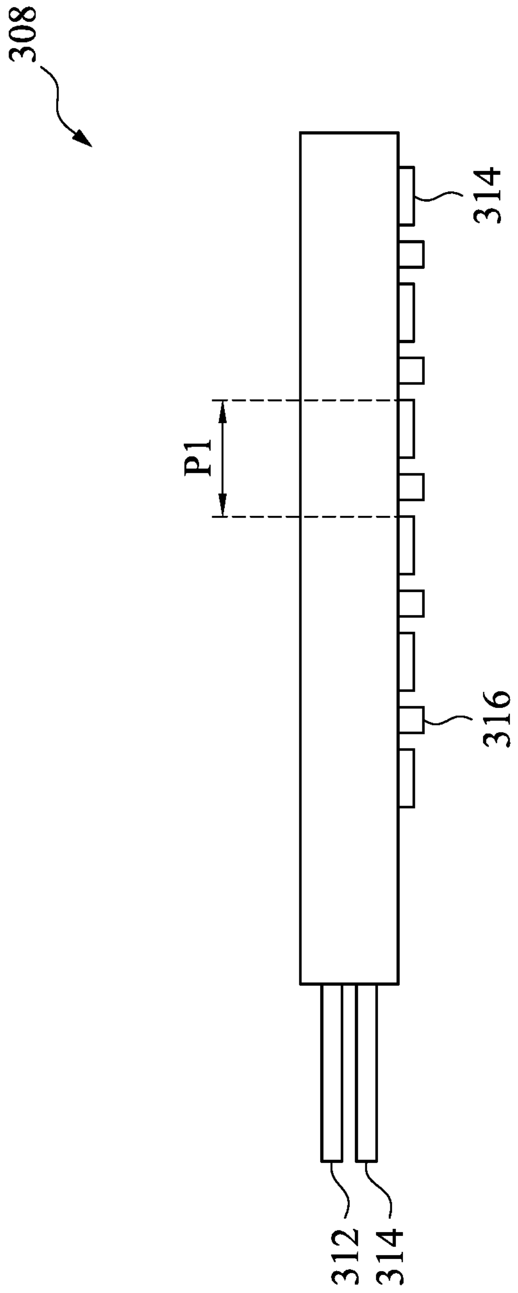

FIGS. 7A and 7B show a bottom up view and a side view of the slurry arm 308, respectively, in accordance with some embodiments. A first side of the slurry arm 308 shown in FIG. 7A may be a side of the slurry arm 308 that faces the polishing pad 304 in the CMP system 300, as shown in FIG. 6. The first side of the slurry arm 308 comprises an array of light sources 314, such as light bulbs, light-emitting diodes, or the like. The light sources 314 may be sources of the optical radiation 221. The first side of the slurry arm 308 further comprises an array of slurry nozzles 316. The slurry nozzles 316 may be sources of the first CMP slurry 120 and the second CMP slurry 140. Each slurry nozzle 316 may be disposed between or among corresponding neighboring light sources 314. As a result, the array of light sources 314 and the array of slurry nozzles 316 may be intermixed without overlapping. By disposing the slurry nozzles 316 beside the delocalized light sources 314 on the slurry arm 308, the optical radiation 221 may be more effectively interact with the first CMP slurry 120 and the second CMP slurry 140 as the first CMP slurry 120 and the second CMP slurry are dispensed, which leads to a higher quantity of free radicals generated by the first CMP slurry 120 and the second CMP slurry 140, thereby resulting in higher removal rates of the conductive materials on the top surface of the work piece 200. A first pitch P1 between two neighboring light sources 314 in the horizontal direction may be in a range from about 0.1 cm to about 1 cm, such as about 0.5 cm. A second pitch P2 between two neighboring light sources 314 in the vertical direction may be in a range from about 0.1 cm to about 1 cm, such as about 0.5 cm. The quantities, shapes, locations, and patterns of the array of light sources 314 and the array of slurry nozzles 316 shown in FIGS. 7A and 7B are provided for illustrative purposes, other quantities, shapes, locations, and patterns of the array of light sources 314 and the array of slurry nozzles 316 are also contemplated.

Figure 8A:
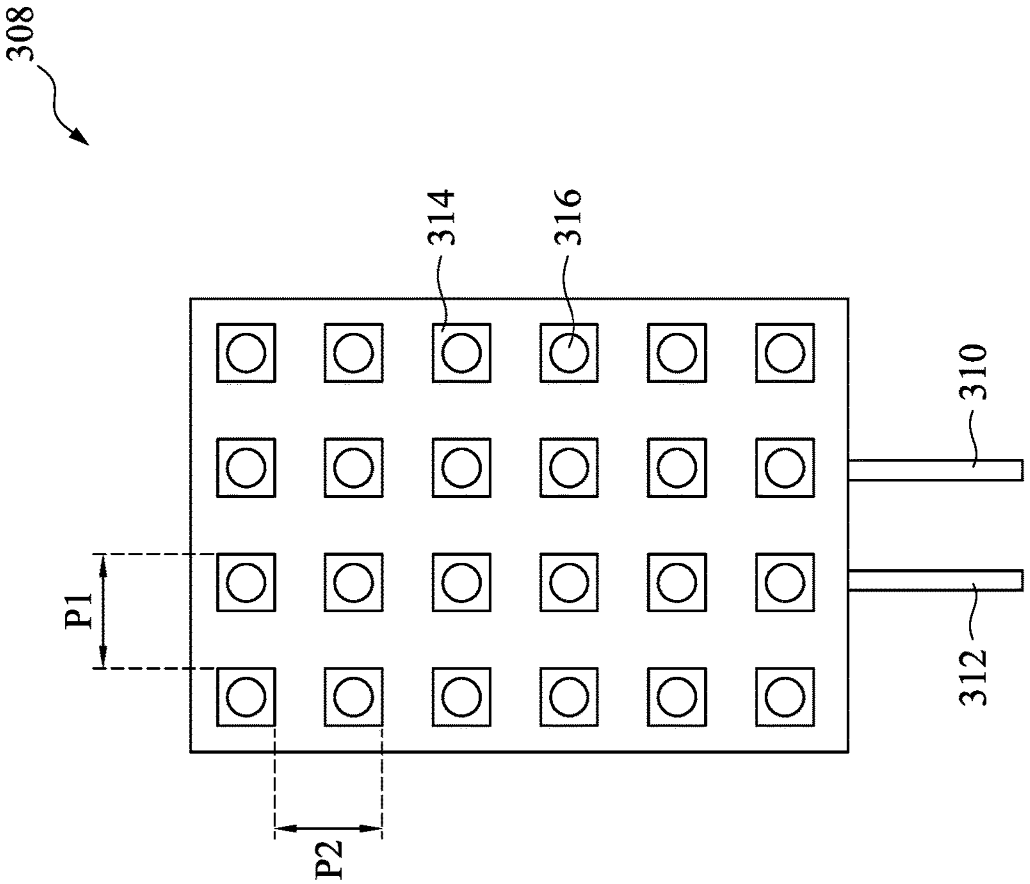
Figure 8B:
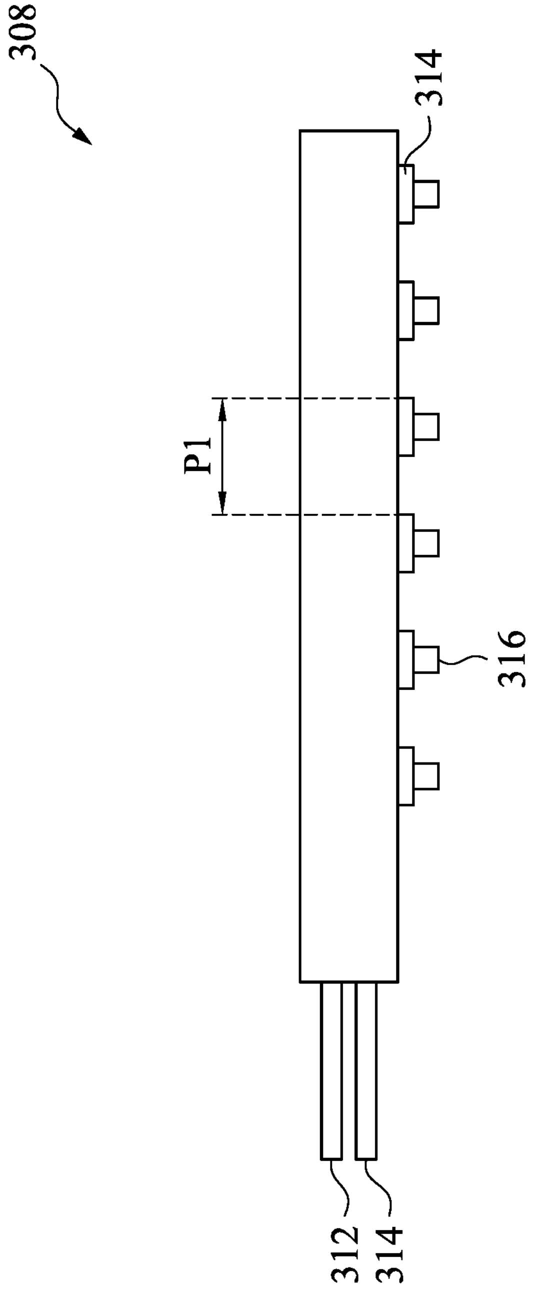

FIGS. 8A and 8B show a bottom up view and a side view of the slurry arm 308, respectively, in accordance with some embodiments. A first side of the slurry arm 308 shown in FIG. 8A may a side of the slurry arm 308 that faces the polishing pad 304 in the CMP system 300, as shown in FIG. 6. The first side of the slurry arm 308 comprises an array of light sources 314, such as light bulbs, light-emitting diode, or the like. The light sources 314 may be sources of the optical radiation 221. The first side of the slurry arm 308 further comprises an array of slurry nozzles 316. The slurry nozzles 316 may be sources of the first CMP slurry 120 and the second CMP slurry 140. Each slurry nozzle 316 may be disposed over the corresponding light source 314 and each slurry nozzle 316 may comprise a transparent material, such as glass or the like. As a result, the array of light sources 314 may overlap the array of slurry nozzles 316 in the bottom up view. By disposing the slurry nozzles 316 over the delocalized light sources on the slurry arm 308, the optical radiation 221 may be more effectively interact with the first CMP slurry 120 and the second CMP slurry 140 as the first CMP slurry 120 and the second CMP slurry 140 are dispensed, which leads to a higher quantity of free radicals generated by the first CMP slurry 120 and the second CMP slurry 140, thereby resulting in higher removal rates of the conductive materials on the top surface of the work piece 200. A first pitch P1 between two neighboring light sources 314 in the horizontal direction may be in a range from about 0.1 cm to about 1 cm, such as about 0.5 cm. A second pitch P2 between two neighboring light sources 314 in the vertical direction may be in a range from about 0.1 cm to about 1 cm, such as about 0.5 cm. The quantities, shapes, locations, and patterns of the array of light sources 314 and the array of slurry nozzles 316 shown in FIGS. 8A and 8B are provided for illustrative purposes, other quantities, shapes, locations, and patterns of the array of light sources 314 and the array of slurry nozzles 316 are also contemplated.

The embodiments may have some advantageous features. By forming the abrasive particles 104 into the spherical shapes, scratches that may be left on the top surface of the work piece 200 may be eliminated or reduced. By forming the protective layers 106 over the abrasive particles 104, the shelf life of the protected abrasive particle solution 100 may be prolonged, thereby reducing the cost of forming the CMP slurries and performing the CMP processes, and increasing the efficiency thereof. By controlling the pH value of the first CMP slurry 120 and the second CMP slurry 140, the protective layers 106 over the abrasive particles 104 may be completely removed or partially removed, which results in different functionalities of the first CMP slurry 120 and the second CMP slurry 140 during various CMP processes. By disposing the slurry nozzles 316 near the delocalized light sources on the slurry arm 308, the optical radiation 221 may be more effectively interact with the first CMP slurry 120 and the second CMP slurry 140, which leads to a higher quantity of free radicals generated by the first CMP slurry 120 and the second CMP slurry 140, thereby resulting in higher removal rates of the conductive materials on the top surface of the work piece 200 during the CMP processes.

In an embodiment, a method of performing a polishing process includes forming spherical titanium dioxide nano-particles; covering the spherical titanium dioxide nano-particles with an organic coating; storing the spherical titanium dioxide nano-particles together with an oxidizer; forming a polishing solution with the spherical titanium dioxide nano-particles; applying the polishing solution on a surface of a work piece; and polishing the surface of the work piece with the polishing solution. In an embodiment, the spherical titanium dioxide nano-particles are formed to be single crystals. In an embodiment, more than half of the spherical titanium dioxide nano-particles are formed to have an anatase crystalline structure. In an embodiment, less than half of the spherical titanium dioxide nano-particles are formed to have a rutile crystalline structure. In an embodiment, the method further includes storing the spherical titanium dioxide nano-particles together with the oxidizer for at least ten days. In an embodiment, the oxidizer comprises hydrogen peroxide. In an embodiment, the method further includes exposing the polishing solution to ultraviolet light while applying the polishing solution on the surface of the work piece.

In an embodiment, a method of performing a chemical mechanical polishing (CMP) process includes forming single-crystalline titanium dioxide nano-particles; forming a protective layer of organic material on the single-crystalline titanium dioxide nano-particles; storing the single-crystalline titanium dioxide nano-particles for a period of time; forming a CMP slurry with the single-crystalline titanium dioxide nano-particles and an acid, wherein the acid removes the protective layer of organic material; applying the CMP slurry and optical radiation on a surface of a device; and polishing the surface of the device with the CMP slurry. In an embodiment, the single-crystalline titanium dioxide nano-particles are formed to be spherical. In an embodiment, the protective layer of organic material comprises silicon. In an embodiment, the protective layer of organic material comprises straight hydrocarbon chains. In an embodiment, each of the straight hydrocarbon chains comprises less than three carbon atoms. In an embodiment, the surface of the device comprises ruthenium. In an embodiment, the method further includes adjusting a pH value of the CMP slurry by adjusting a concentration of the acid to completely remove the protective layer of organic material. In an embodiment, the surface of the device comprises ruthenium and silicon dioxide. In an embodiment, the method further includes adjusting a pH value of the CMP slurry by adjusting a concentration of the acid to partially remove the protective layer of organic material.

In an embodiment, a chemical mechanical polishing (CMP) apparatus includes a polishing pad on a platen; a work piece carrier over the polishing pad; and a slurry arm over the polishing pad, the slurry arm comprising: an array of slurry nozzles; and an array of light sources. In an embodiment, each one of the array of slurry nozzles is disposed beside a corresponding one of the array of light sources in a bottom up view. In an embodiment, each one of the array of slurry nozzles overlaps a corresponding one of the array of light sources in a bottom up view. In an embodiment, the array of slurry nozzles are transparent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of performing a polishing process, the method comprising:

forming spherical titanium dioxide nano-particles;

covering the spherical titanium dioxide nano-particles with an organic coating;

storing the spherical titanium dioxide nano-particles together with an oxidizer;

forming a polishing solution with the spherical titanium dioxide nano-particles, wherein the organic coating on the spherical titanium dioxide nano-particles is at least partially removed after forming the polishing solution with the spherical titanium dioxide nano-particles;

applying the polishing solution on a surface of a work piece; and polishing the surface of the work piece with the polishing solution.

2. The method of claim 1, wherein the spherical titanium dioxide nano-particles are formed to be single crystals.

3. The method of claim 2, wherein more than half of the spherical titanium dioxide nano-particles are formed to have an anatase crystalline structure.

4. The method of claim 2, wherein less than half of the spherical titanium dioxide nano-particles are formed to have a rutile crystalline structure.

5. The method of claim 1 further comprising storing the spherical titanium dioxide nano-particles together with the oxidizer for at least ten days.

6. The method of claim 1, wherein the oxidizer comprises hydrogen peroxide.

7. The method of claim 1 further comprising exposing the polishing solution to ultra-violet light while applying the polishing solution on the surface of the work piece.

8. A method of performing a chemical mechanical polishing (CMP) process, the method comprising:

forming single-crystalline titanium dioxide nano-particles;

forming a protective layer of organic material on the single-crystalline titanium dioxide nano-particles;

storing the single-crystalline titanium dioxide nano-particles for a period of time;

forming a CMP slurry with the single-crystalline titanium dioxide nano-particles and an acid, wherein the acid removes the protective layer of organic material;

applying the CMP slurry and optical radiation on a surface of a device; and polishing the surface of the device with the CMP slurry.

9. The method of claim 8, wherein the single-crystalline titanium dioxide nano-particles are formed to be spherical.

10. The method of claim 8, wherein the protective layer of organic material comprises silicon.

11. The method of claim 8, wherein the protective layer of organic material comprises straight hydrocarbon chains.

12. The method of claim 11, wherein each of the straight hydrocarbon chains comprises less than three carbon atoms.

13. The method of claim 8, wherein the surface of the device comprises ruthenium.

14. The method of claim 13 further comprising adjusting a pH value of the CMP slurry by adjusting a concentration of the acid to completely remove the protective layer of organic material.

15. The method of claim 8, wherein the surface of the device comprises ruthenium and silicon dioxide.

16. The method of claim 15 further comprising adjusting a pH value of the CMP slurry by adjusting a concentration of the acid to partially remove the protective layer of organic material.

17. A method of performing a chemical mechanical polishing (CMP) process, the method comprising:

forming titanium dioxide nano-particles, wherein a first quantity of the titanium dioxide nano-particles comprise an anatase crystalline structure, wherein a second quantity of the titanium dioxide nano-particles comprise a rutile crystalline structure, and wherein the first quantity is larger than the second quantity;

forming protective layers on the titanium dioxide nano-particles;

storing the titanium dioxide nano-particles with the protective layers;

forming a CMP slurry by mixing the titanium dioxide nano-particles with the protective layers and an acid, wherein the acid at least partially removes the protective layers from the titanium dioxide nano-particles;

applying the CMP slurry and optical radiation on a surface of a device; and polishing the surface of the device with the CMP slurry.

18. The method of claim 17, wherein the titanium dioxide nano-particles are single-crystalline and spherical.

19. The method of claim 17, wherein the protective layers comprise an organic material comprising silicon and straight hydrocarbon chains.

20. The method of claim 17, further comprising oxidizing the titanium dioxide nano-particles with the protective layers with hydrogen peroxide.

* * * * *